US012742998B2

(12) United States Patent
Grossman et al.

(10) Patent No.: US 12,742,998 B2
(45) Date of Patent: Sep. 22, 2026

(54) BONDING OPTICAL MATERIALS

(71) Applicant: GAMDAN Optics, Inc., San Jose, CA (US)

(72) Inventors: William M. Grossman, San Jose, CA (US); Dennis J. Garrity, San Jose, CA (US); Hui Cai, San Jose, CA (US)

(73) Assignee: GAMDAN Optics, Inc., San Jose, CA (US)

( * ) Notice: Subject to any disclaimer, the term of this patent is extended or adjusted under 35 U.S.C. 154(b) by 262 days.

(21) Appl. No.: 18/583,583

(22) Filed: Feb. 21, 2024

(65) Prior Publication Data

US 2024/0280878 A1 Aug. 22, 2024

Related U.S. Application Data

(60) Provisional application No. 63/486,464, filed on Feb. 22, 2023.

(51) Int. Cl.

| | |
|---|---|
| ***G02F 1/355*** | (2006.01) |
| ***C30B 29/22*** | (2006.01) |
| ***C30B 33/06*** | (2006.01) |
| ***G02F 1/37*** | (2006.01) |

(52) U.S. Cl.

CPC ............ *G02F 1/3551* (2013.01); *C30B 29/22* (2013.01); *C30B 33/06* (2013.01); *G02F 1/37* (2013.01)

(58) Field of Classification Search

CPC ........................................... G02F 1/3551–3553

See application file for complete search history.

(56) References Cited

U.S. PATENT DOCUMENTS

| | | | |
|---|---|---|---|
| 3,633,126 | A | 1/1972 | Martin et al. |
| 4,509,175 | A | 4/1985 | Daly et al. |
| 5,201,977 | A | 4/1993 | Aoshima |
| 5,441,803 | A | 8/1995 | Meissner |

(Continued)

FOREIGN PATENT DOCUMENTS

| | | | |
|---|---|---|---|
| CN | 104577699 | A | 4/2015 |
| CN | 114137747 | A | 3/2022 |

(Continued)

OTHER PUBLICATIONS

Smith, Arlee V. Crystal nonlinear optics: with SNLO examples. Albuquerque, NM, USA: AS-Photonics, 2018, 26 pages.

(Continued)

*Primary Examiner* — Rhonda S Peace

(74) *Attorney, Agent, or Firm* — Fountainhead Law Group, PC

(57) ABSTRACT

In one embodiment, the present disclosure includes a method of making an optical component. Planes of optical materials are diffusion bonded to make a single larger nonlinear optical device. The bond plane may be configured at an angle to an input wave passing through the diffusion bonded structure. In one embodiment, the optical material is Lithium triborate (LBO). In some embodiments, a plurality of optical materials are diffusion bonded in one or more dimensions to produce a larger optical device. In some embodiments, the larger optical device is used in a laser system. In one embodiment, the present disclosure includes a fusion reactor including a laser system comprising diffusion bonded nonlinear optical materials.

44 Claims, 14 Drawing Sheets

(56) References Cited

U.S. PATENT DOCUMENTS

| | | | | |
|---|---|---|---|---|
| 5,846,638 | A | 12/1998 | Meissner | |
| 5,852,622 | A | 12/1998 | Meissner et al. | |
| 7,769,060 | B1 | 8/2010 | Furuya et al. | |
| 2011/0013264 | A1 | 1/2011 | Mu et al. | |
| 2021/0141284 | A1* | 5/2021 | Meissner | G02F 1/3551 |
| 2021/0265802 | A1 | 8/2021 | Seelert et al. | |
| 2024/0280878 | A1* | 8/2024 | Grossman | C30B 33/06 |
| 2025/0036003 | A1* | 1/2025 | Hutchens | G02F 1/365 |

FOREIGN PATENT DOCUMENTS

| | | | |
|---|---|---|---|
| EP | 0456060 | A1 | 9/1995 |
| JP | 2012203013 | A | 10/2012 |

OTHER PUBLICATIONS

Kazakov, Nikolaĭ Fedotovich, ed. Diffusion bonding of materials. Elsevier, 2013, 10 pages.

Lasertec, "Diffusion Bonding Crystals," 2016 [retrieved on May 3, 2024]. Retrieved from the internet: <URL: http://www.lcoptical.com/Laser-Crystals-page-8-96.html>. pp. 1-2.

Tei et al., "Diffusion Bonded KTiOPO4 Crystal for the Second Harmonic Generation of High Average Power Zigzag Slab Nd: YAG Laser," Japan Journal of Applied Physics, vol. 38, Jan. 15, 1999. pp. L35-L37.

International Preliminary Report on Patentability, Application No. PCT/US2024/016773, Gamdan Optics Inc., mailed Jun. 12, 2024.

Rubinstein, Boaz et al., "Effect of intracavity diffusion-bonded optical elements on laser performance." In Solid State Lasers and Amplifiers, vol. 5460, pp. 141-144. SPIE, 2004.

De Vido, Mariastefania, et al. Characterisation of adhesive-free bonded crystalline Yb: YAG for high energy laser applications. Optical Materials Express 7, No. 2 (2017): 425-432.

Inertial Fusion Energy, Report of the 2022 Fusion Energy Sciences Basic Research Needs Workshop, US Department of Energy Office of Science, 2022.

Phillips, Jonathan P et al. "High energy, high repetition rate, second harmonic generation in large aperture DKDP, YCOB, and LBO crystals." Optics Express 24, No. 17 (2016): 19682-19694.

Wang, Jiyang et al. "Recent developments in functional crystals in China." Engineering 1, No. 2 (2015): 192-210.

Hu, Zhanggui. "Development of large-size LBO crystal growth." In JSAP-OSA Joint Symposia, p. 18a_D5_4. Optical Society of America, 2013.

Zeng, Xiaoming et al. "Multi-petawatt laser facility fully based on optical parametric chirped-pulse amplification." Optics letters 42, No. 10 (2017): 2014-2017.

Mark Missey et al., "High-Energy OPO Based on a Diffusion-Bonded Stack of PPLN Plates." Center for Electro-Optics, University of Dayton, Dayton OH 45469. Lawrence E. Myers, Charles Littell, Robert C. Eckardt. USAF Wright Laboratory WWAAJL, Wright-Patterson AFB OH 45433.

International Preliminary Report on Patentability dated Sep. 4, 2025, International Application No. PCT/US2024/016773, 19 pages.

Extended European Search Report dated Jul. 15, 2026, European Patent Application No. 24760950.6, 8 pages.

Li, Da et al. "Spatial Walk-Off Compensated Beta-Barium Borate Stack for Efficient Deep-UV Generation", Proceedings of SPIE, vol. 10516, Feb. 15, 2018, 7 pages.

* cited by examiner

BONDING OPTICAL MATERIALS

CROSS REFERENCE TO RELATED APPLICATIONS

This application claims priority to U.S. Provisional Patent Application Ser. No. 63/486,464, filed on Feb. 22, 2023, the entire contents of which are hereby incorporated herein by reference.

BACKGROUND

The present disclosure pertains to optical materials, and in particular, to technique for bonding and using nonlinear optical materials such as LBO crystals.

Nonlinear crystals are widely used to generate frequencies of light that are not easily obtained directly from lasers. For example, small nonlinear crystals with volumes well less than 1 $cm^3$ are used commercially to convert input infrared (IR) beams of light into output visible or ultraviolet (UV) beams. The IR beams may be pulsed, rather than continuous, with average powers often of tens to hundreds of watts, for example, and peak powers that can be kilowatts, megawatts, or more. Optical parametric oscillators (OPOs) or optical parametric amplifiers (OPAs) can similarly be built using nonlinear crystals.

Lithium triborate ($LiB_3O_5$) crystal (LBOs) is one example of a nonlinear optical crystal. It has a wide transparency range, moderately high nonlinear coupling, high damage threshold and a variety of desirable chemical and mechanical properties. This crystal is often used for second harmonic generation in lasers, for example. LBOs also have exceptional power handling capacity.

LBO crystals, like all nonlinear optics, are oriented to efficiently generate harmonics or for other nonlinear processes. A geometry for LBO and Type I (i.e., frequency doubling with same polarization) second harmonic generation is illustrated in FIG. 1. Input light enters a nonlinear crystal, and in this example an LBO crystal is cut for Type I second harmonic generation (SHG). The crystal axes are shown as x, y, z. The input light wave vector is $k_\omega$ and the polarization is horizontal (into or out of the plane of the drawing). The output is the second harmonic of the input, and its wave vector is $k_{2\omega}$. The output light is vertically polarized, in the plane of the drawing. The crystal axes may be oriented for phase matching (e.g., the x-axis of the crystal is displaced from the orientation of $k_\omega$ by an angle of $\theta_{PM}$).

Nonlinear crystals, including LBOs are made by first growing a piece of single-crystalline material. This raw crystal is then oriented and cut into parts of the desired shape. Then, grinding and polishing complete the surface fabrication. Optical coatings may then be applied.

An optical aperture may be defined by the area of a surface where light enters the optical crystal material. However, scaling some optical materials, such as LBOs, in production to large apertures is daunting. Some issues that limit the production of LBOs with dimensions exceeding about 50 mm may include (1) the time to grow crystals can extend from months to over a year, (2) the optical homogeneity and quality is worse in very large crystals, and (3) crucibles for growing large LBOs, which are made from precious metals, become excessively expensive.

Increasing the aperture of high performance nonlinear optical crystals, such as LBOs, will allow them to be used in a wide range of emerging applications, such as laser systems, including controlled laser fusion as well as other uses.

BRIEF DESCRIPTION OF THE DRAWINGS

With respect to the discussion to follow and in particular to the drawings, it is stressed that the particulars shown represent examples for purposes of illustrative discussion and are presented to provide a description of principles and conceptual aspects of the present disclosure. In this regard, no attempt is made to show implementation details beyond what is needed for a fundamental understanding of the present disclosure. The discussion to follow, in conjunction with the drawings, makes apparent to those of skill in the art how embodiments in accordance with the present disclosure may be practiced.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Note that in the following figures, the direction of light beam wave vectors are denoted by the symbol k. Light traveling through an optical crystal material experiences different refractive indices in different directions. These differences in refractive index are often used to define the crystal orientation, and may be specified as an x-axis, y-axis, and z-axis. For example, in an LBO crystal the direction inside the crystal where the electric field of the light wave sees the highest refractive index may be referred to as the z-axis, the direction inside the crystal where the field sees the lowest refractive index may be referred to as the x-axis, and the other direction inside the crystal may be referred to as the y-axis. As another example, for a BBO crystal, one axis (z) has a particular refractive index, and the other two axes have the same refractive index as each other. Accordingly, for BBO, the crystal orientation is often specified such that the x-axis and y-axis are specified as the two directions inside the crystal having the same index of refraction and the z-axis is the direction inside the BBO crystal having a different refractive index (e.g., higher or lower than the x-axis and y-axis, and in the case of BBO the refractive index in the z direction is lower). One of ordinary skill in the art will understand that other optical crystal materials may be similarly associated with crystal orientations for the particular crystal type for applying the techniques described herein. Accordingly, the embodiments described below are merely illustrative.

EXAMPLE APPLICATIONS AND BACKGROUND

Light propagation, phase matching, and other phenomena in an optical crystal according to various embodiments illustrated below are described by way of example in the following paragraphs. The following material illustrates optical properties useful in understanding various aspects, features, and advantages of the innovative techniques described herein.

Figure 1:
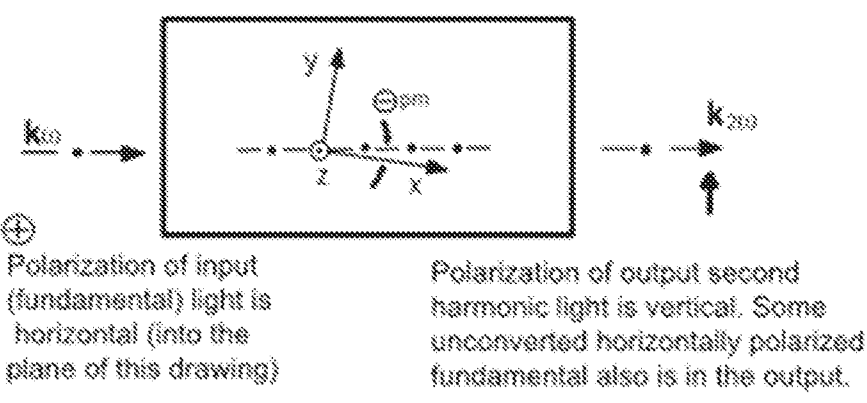
FIG. 1 illustrates an example light beam traveling through an optical crystal material.

FIG. 1 illustrates a light beam traveling through an optical crystal material. In this example, the light is traveling along a path specified by the k-vector (kω) at a phase matching angle (θpm) to the x-axis, and the z-axis is out of the page. Such systems may be used to generate harmonics of the fundamental light frequency, thereby increasing the frequency of the light and decreasing the wavelength. For example, in Type I second harmonic generation (SHG), two photons having the same polarization with respect to the crystal combine to form one photon with double the frequency. In Type II SHG, two photons having orthogonal polarizations combine to form one photon with double the frequency. As a more specific example, beams going through LBO crystals oriented for Type I second harmonic generation may have an input wavelength of about 1064 nm, and k is perpendicular to the LBO z axis. The crystal axes are designated x, y, and z, following the standard conventions mentioned above, and the x, y, and z planes are the planes perpendicular to those axes, respectively. In the following drawings the direction of the arrow labeled k indicates the wave direction just inside the nonlinear crystal, although the symbol, k, is drawn outside of the crystal in the figures where there is more space for illustrative purposes. In several figures k is drawn perpendicular to the surface of LBO crystals; however, this is approximated for illustrative purposes. The direction of the light may be tilted by a small amount (typically ~0.5 degrees) with respect to the crystal's surface-normal to avoid back-reflections or etalon effects. Regardless, the beam inside the crystal is oriented at the phase matching angle within tight tolerances so that the direction of the beam is phase matched with respect to the appropriate crystal axes.

For an LBO crystal being used at approximately room temperature, 300K which is about 27 C, phase matching angles may be determined for Type I SHG as theta=90 degrees and phi=11.4 degrees. The two angles specify a direction in radial coordinates. Theta is 90 degrees, which results in the k vector 90 degrees off of the z axis. Thus, in this example, the k vector is in the x-y plane. In some instances, the phase matching angle is referred to as just the value of phi since theta is 90 degrees and over a range of wavelengths and temperatures phi doesn't change. Accordingly, phi is 11.4 degrees off of the x axis. The polarization of the 1064 nm light, for example, is oriented along the z axis. The 1064 nm input beam propagates in the x-y plane, and the polarization is perpendicular to the beam direction (the k vector). The light polarized along the z axis sees the largest refractive index. In this example of 1064 nm light polarized along z axis, the refractive index is 1.6053. The speed of light for this is c divided by 1.6053, where c is the speed of light in vacuum. The 532 nm green light will see a higher refractive index if it is polarized the same direction as the 1064 nm light because shorter wavelengths interact more with materials. A laser SHG system may be configured so the 532 nm beam and 1064 nm beam experience the same refractive index, 1.6053. Accordingly, the polarization of the generated 532 nm light is oriented in a different direction than the polarization of the 1064 nm light. For 532 nm light polarized along the different axes (x, y or z) the refractive indices, n, are as follows: polarized along x: n=1.5785 (too small), polarized along y: n=1.6064 (just a little too big), polarized along z: n=1.6215 (far too big). Based on these refractive indices, inside the crystal the light's polarization for the 532 nm light may be almost along y, but a little toward x, to achieve the target index of 1.6053. However, the 532 nm light's polarization is essentially perpendicular to the beam propagation (i.e., perpendicular to the k vector). Consequently, the beam propagation (i.e., the k vector) for the green light may be configured to be mostly along the x axis, but tilted toward the y axis. This, phase matching occurs at 11.4 degrees of angular tilt in this example. That makes the refractive index that the 532 nm light experiences equal to 1.6053. Note that phi may be +11.5 or −11.5 degrees for phase matching to occur. In some example cases, a crystal is oriented at about 11.4 degrees so the beam would enter at normal incidence. Thus, the beam in the crystal would come close to squaring up with the input and output surfaces. However, inside the crystal the beam is going along at an angle of 11.4 degrees to the x-axis in this example.

In the example above, the k-vector of the 1064 nm (and/or 532 nm) beam is not going along parallel to any crystal axis.

It is going perpendicular to one of the axes, the z axis. Both the fundamental beam at 1064 nm and the second harmonic beam at 532 nm have their k vectors in the same direction. The value of k depends on the wavelength, and the k vectors for 1064 and 532 are both in the same direction. In some embodiments an optical crystal material may be cut such that the input and output surfaces of the crystal are both perpendicular to the axes. However, using the example above, the k-vector is still 11.4 degrees off the x axis in the x-y plane inside the crystal. However, the angle the beam comes into the crystal is not 11.4 degrees because light refracts (bends) as it passes into a material. If the refractive index of air is about 1, and the refractive index of the LBO is about 1.6053 in this case; then by Snell's Law the sine of the angle in air will equal 1.6053 times the sine of the angle in the material, and the angle in the material is 11.4 degrees for phase matching. Solving this gives an angle in air of about 18.4 degrees off of normal to the surface. However, this is just one example. For third harmonic generation (THG) the angles are different. For example, 354.7 nm is the third harmonic of 1064. To get the third harmonic in LBO, the fundamental (1064 nm) is mixed with the second harmonic: 1+2=3. For LBO at 300K with inputs of 1064 nm and 532 nm, an output of about 354.7 nm, and with the commonly used Type II phase matching, the angle for phase matching is theta=42.6 degrees and phi=90 degrees, for example.

For second harmonic generation (SHG) or third harmonic generation (THG) the phase matching angles depend on the temperature. LBO is typically more sensitive to temperature changes than BBO. Consider the case of LBO, SHG, and Type I. For example, starting at room temperature, as the crystal becomes hotter, the refractive indices change, and the phase matching angle, phi, gets smaller until it goes to zero. For LBO and Type I SHG there is one special temperature that has a unique phase matching solution where phi is zero and theta is 90 degrees. That is commonly referred to as "Noncritical Phase Matching." This occurs for 1064 nm input going into an LBO crystal at input a temperature of about 150 C (equaling about 422 K). Accordingly, in this special case the beam (k-vector) is along a crystal axis (e.g., the x-axis). In some applications, the noncritical phase matching is used to achieve advantageous angular insensitivities, for example. Noncritical Phase Matching temperatures and other parameters also exist for some other applications and optical crystals, but the values are typically different.

EXAMPLE EMBODIMENTS

Features and advantages of the present disclosure include using diffusion bonding to fuse two or more smaller optical crystal materials into one larger composite optical crystal material structure. The resulting structure may have effectively invisible bond lines in the optical beam path. The present disclosure includes a scalable multistep bonding process in which many optical crystal material parts can be bonded. In some embodiments, the bond lines may not need to be avoided or shadowed for protection. Furthermore, some embodiments of the disclosed process may be applied to other optical crystal materials (including other nonlinear materials), such as (but not limited to) beta barium borate (BBO), for example. One advantage of the techniques disclosed herein include the ability to meet the increasing needs for large aperture optical crystals (e.g., LBO) or greater length crystals (e.g., BBO), for example.

Figure 2:
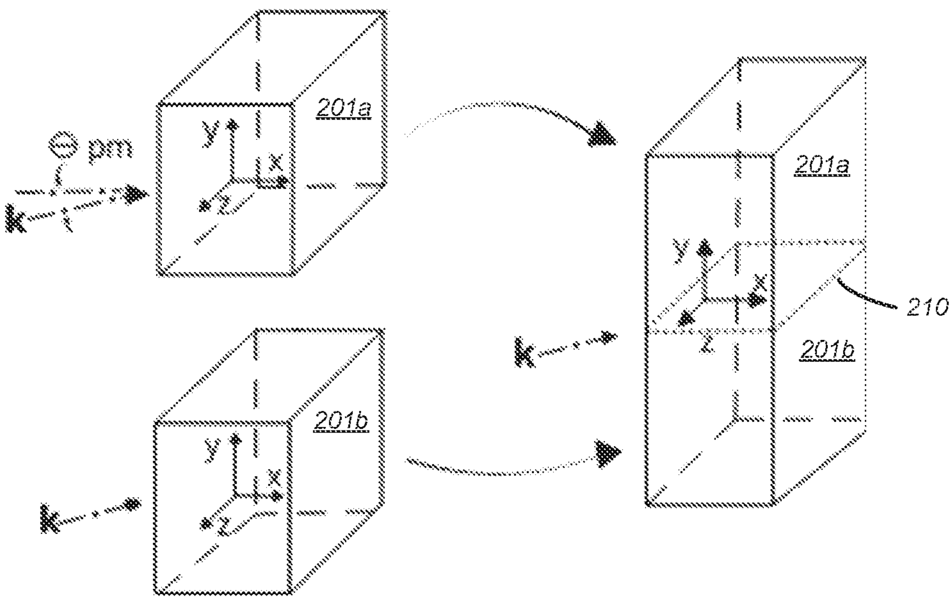
FIG. 2 illustrates bonding LBO crystals in the y-plane according to an embodiment.

FIG. 2 illustrates bonding LBO crystals in the y-plane according to an example embodiment. In this illustrative example, two separate LBO pieces 201*a* and 201*b* are shown. In this illustrative example, LBO pieces 201*a* and 201*b* may have the same shape and the same crystalline orientation. LBO parts 201*a-b* are bonded into one LBO piece along planar surfaces of each LBO piece. In this example, the crystals are oriented with all three axes perpendicular to surface faces of the crystal, and the input beam is tilted by the angle, $\theta_{PM}$, from the normal (here, off the x-axis) as it enters the crystal. Dotted lines 210 illustrate the bond, where bonds meet external surfaces of each piece. After bonding, the surface planes are coplanar. Further, a cross sectional area of the diffusion bonded first optical crystal material 201*a* and second optical crystal material 201*b* (e.g., along the y-axis) is greater than a cross sectional area of the first optical crystal material and a cross sectional area of the second optical crystal material. Well-made bonds may be virtually invisible on the actual parts. For example, a diffusion bond is created by optically contacting (e.g., contacting smooth, flat, optical quality surfaces) the two precision polished surfaces, followed by heating in a furnace to less than the melting temperature of the crystal. At this elevated temperature, molecules of the substrates become mobile and intermesh with each other. Diffusion bonding may be performed with super polished surfaces with very low defect levels (ideally none), cleaned to leave no contamination and optically contacted cleanly before heating. A polished surface may be a surface that is a defect free (no scratches or digs) surface when examined under intense light, such as that from a fiber optic bundle light source or similar microscope illuminator, with both the unaided human eye and with a microscope at 50 power or greater magnification, for example. In addition, the angle of incidence of the light beam may be varied to create the greatest visibility. This atomic level "welding" of two or more pieces yields a single part with the properties of a monolithic crystal. After the parts are bonded to make the larger part, additional grinding and polishing steps (not illustrated) may be performed to yield a finished part that may receive optical coatings, for example.

Diffusion bonding may be done within a range of temperatures depending on the optical crystal material type, the volume of the crystals, and surface area, for example. Generally, the temperature for the bonding (or "soak") portion of the cycle is between 60% to 90% of the melting point of the particular type of optical crystal material. The length of the soaking time is partially dependent on the volume of the crystal and the faces' area. In one embodiment, there is a gradual heating, or ramp-up, whose length depends on the volume of the crystal, its thermal conductivity, and its expansion coefficient(s). After the bonding has completed, a slow cooling occurs, again dependent on the size and properties of the crystal. This part of the cycle may also be slow enough to anneal any internal stresses that may have occurred during the earlier processing.

Certain embodiments of the present disclosure include diffusion bonding two of the same crystal materials having the same crystal orientation. Accordingly, the optical crystal materials being diffusion bonded may be aligned prior to heating, for example. In some example embodiments, the crystalline axis alignment has to be within a certain tolerance that is in the order of 40 arc seconds for a Type I SHG. However, this requirement may be different for different applications and may be inverse proportional to the thickness of the material. The following are example alignment specifications based on the tolerances acceptable for phase matching for certain applications (e.g., harmonic generation for powerful beams to be use in laser fusion). However, tolerances can also be limited by the constraints of getting a good bond over a surface, and with angular mismatches between the bonding parts there will be some mismatch in the coefficient of thermal expansion. This may also constrain the tolerances, especially over larger bond lengths.

(1) Type I SHG, alignment tolerance of 40 arc seconds for ~10 mm thick samples.
(2) Type II SHG, alignment tolerance 2 times (1) above; hence a looser tolerance than (1).
(3) NCPM SHG, alignment tolerance ~100× of (1) above, a yet looser tolerance than (1).
(4) Type II THG, alignment tolerance ~⅔ times of (1) above, a tighter tolerance than (1).
(5) Type I THG, alignment tolerance ~¼ times of (1) above, a tighter tolerance than (1).
(6) Ultrafast application requiring crystals that may be ~0.1 mm thick, alignment tolerance ~100× of (1) above, a looser tolerance than (1).

In some embodiments, and as discussed further below, the bonding plane may advantageously be at an angle to the light path (e.g., so there will not be any localized distortion or shadow in the light from imperfections in the bond). In various embodiments, the angle of the k-vector to the diffusion bond plane between two diffusion bonded crystals may be 0.25 degrees to 45 degrees, for example.

The wavefront distortion of the beam going through the bonding plane has to be limited to as low as a tenth of a wavelength (lambda/10), or less, up to a half a wavelength (lambda/2), for example. This is a measurement of the distortion of light as it travels through a medium and the optimization of this parameter may be different from one application to another. Absorption across the bond plane should be as low as possible and comparable to the monolithic crystal for high energy lasers. In some example embodiments, absorption across the bond plane is less than 20 ppm/cm of the crystal, for example.

Laser-Induced Damage Threshold (LiDT) typically refers to the maximum intensity that a laser optic can withstand before being damaged. LiDT of the bonding plane may be as close to that of the bulk crystal as possible. In some example embodiments, a super polishing process may produce an LiDT of greater than 95 J/cm2 at 355 nm with ns pulses at 20 Hz, for example. In some embodiments, the diffusion bond plane has a similar LiDT as the rest of the bulk crystal material on both sides of the bond, for example.

In some cases, the two pieces 201*a-b* of the diffusion bonded pair may have a slight mismatch of crystalline axis which can be detected during the phase matching process (e.g., in the nonlinear process to achieve light of different wavelengths). In some embodiments, the process may be arranged, ideally, to minimize this mismatch. However, the mismatch is not zero as in a monolithic crystal. The present techniques achieve acceptable performance with the bonded crystals with nonzero mismatch, for example. Bonding planes, such as plane 210, may in some cases be visually detectable due to, for example, the defects left behind from the polishing process. The process may be arranged to minimize such defects to an acceptable level of performance. Sometimes the bond line is apparent on an edge of the bonded crystal. For example, an outside edge may not have bonded completely. If such a bond line is visible only outside the clear aperture (where the light is not passing through, e.g., the outer edges) then it may have a minimal effect on the performance, for example.

The surface quality of an optical component is a specification that measures the surface imperfections of the component, such as scratches or digs (pits in the surface). Usually, surface quality is evaluated according to the standards defined by the United States Military or the International Organization for Standardization. According to the former, the surface quality measurement is expressed by two numbers scratch and dig. The scratch number evaluates the brightness of scratches on the surface, while dig measures the size of the largest dig present on the component. In both cases lower numbers mean a higher quality surface. Reflected wavefront distortion (RWD), sometimes referred to as reflected wavefront error (RWE), specifies a deviation from a perfectly flat plane wave of the reflected component of incident light. For certain example bonding processes described herein, including FIG. 2, a first example step may include polishing the bonded surfaces in preparation for bonding, typically with a 0-0 scratch-dig surface quality (e.g., MIL-PRF-13830 Rev. B) and a reflected wavefront distortion within lambda/10 (at 633 nm) as measured with a laser interferometer, for example.

Figure 3:
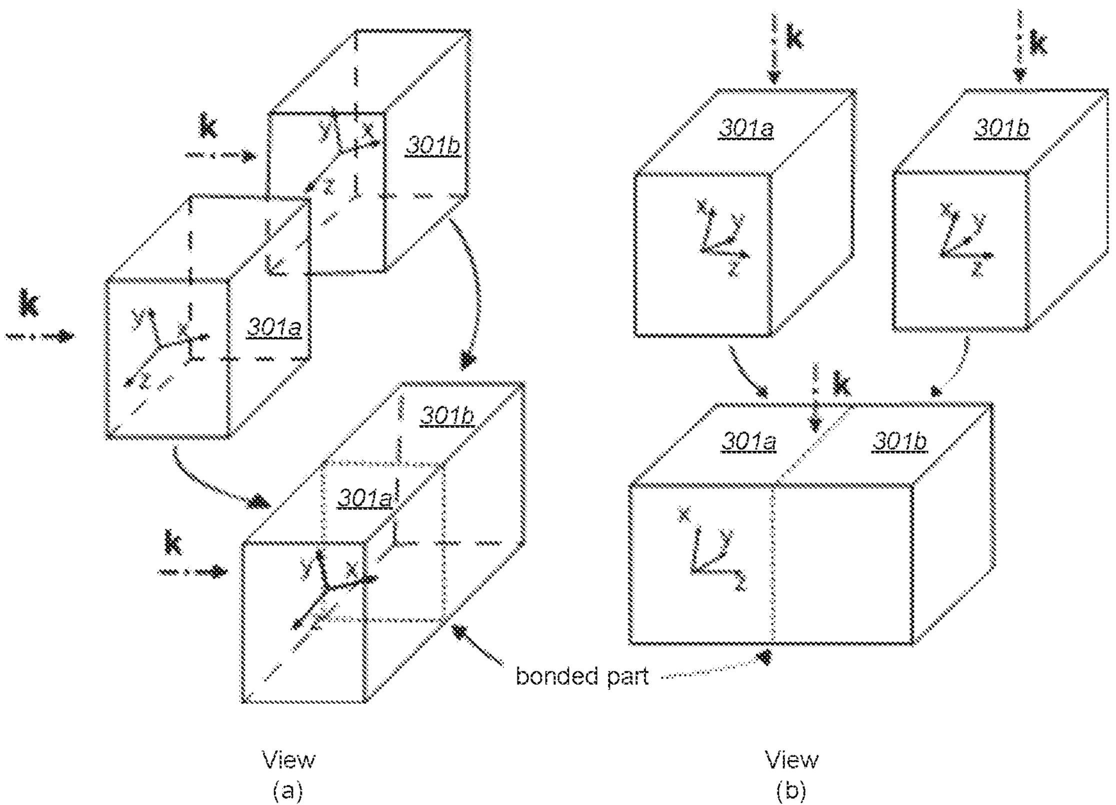
FIG. 3 illustrates bonding LBO crystals in the z-plane according to an embodiment.

FIG. 3 illustrates bonding LBO crystals in the z-plane according to an embodiment. In this example, bonds are made along the z-plane. In view (a), two pieces 301*a* and 301*b* of an LBO are bonded to form the larger part below. In view (b), the same process is shown, but as observed from the perspective of the top of view (a). In this example, the k vector is parallel to the plane of the bond, and so the beam propagates directly down the bond. The beam extends in two transverse dimensions as it propagates, and just a narrow line-like sector of the beam's 2-dimensional extent crosses the thin bond line. Note that as shown in view (b) of FIG. 3, the phase matching is correct because the crystal is tilted over with respect to the surfaces of the crystal pieces (and composite piece) by the phase matching angle, $\theta_{PM}$.

Figure 4:
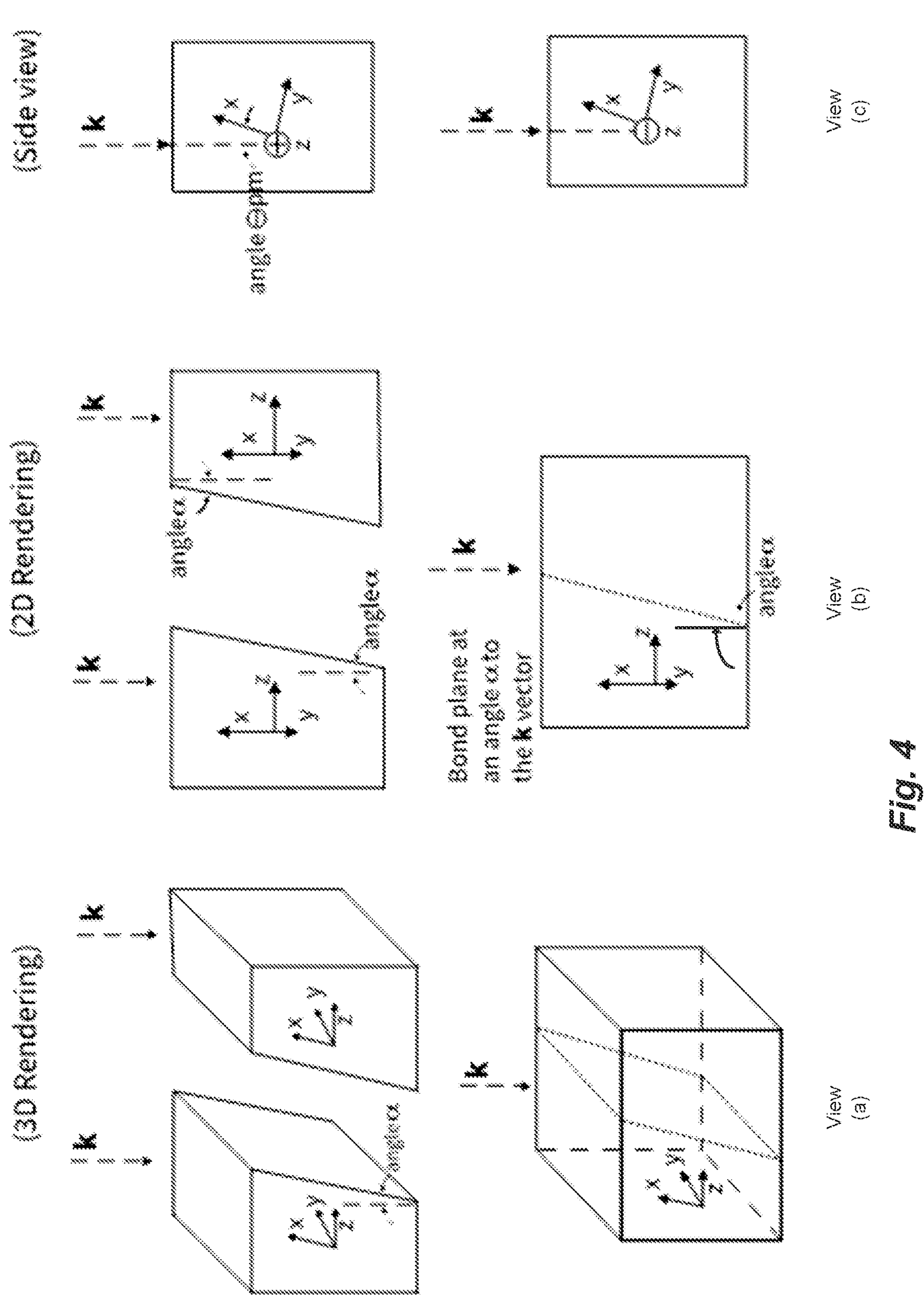
FIG. 4 illustrates angled bond lines according to an embodiment.

FIG. 4 illustrates angled bond lines according to an embodiment. In this example, two LBO pieces are bonded along the z-axis at an angle, such that the beam does not propagate directly down the bond line plane as it does in FIG. 3, which may advantageously reduce beam distortions from the bonds, for example. In this example embodiment, the LBO pieces may be trapezoidal in one cross section, for example. In other embodiments described below, the crystal axes are rotated relative to the bond line so that the beam crosses the bond line at an angle as it propagates down one or more of the crystal axes to reduce distortion. The arrangement in this example is shown in 3-dimensions in view (a), the same process is shown in 2 dimensions in view (b), and a 2-dimensional view along the z-axis is shown in view (c). Here, the LBO pieces in view (a) can be seen to be cut at a bond angle, α, off of parallel to the z-plane, so instead of the wave vector, k, being parallel to the bond plane, the light propagates in a different direction than the bond line—e.g., the bond line and direction of propagation are different by the angle α. The beam extends in two transverse dimensions as it propagates. A broad two-dimensional sector of the beam crosses the bond plane, but the beam is less affected by the angled bond than the beam going through a parallel bond plane as in FIG. 3 (e.g., if the bond angle were zero or nearly zero).

Figure 5:
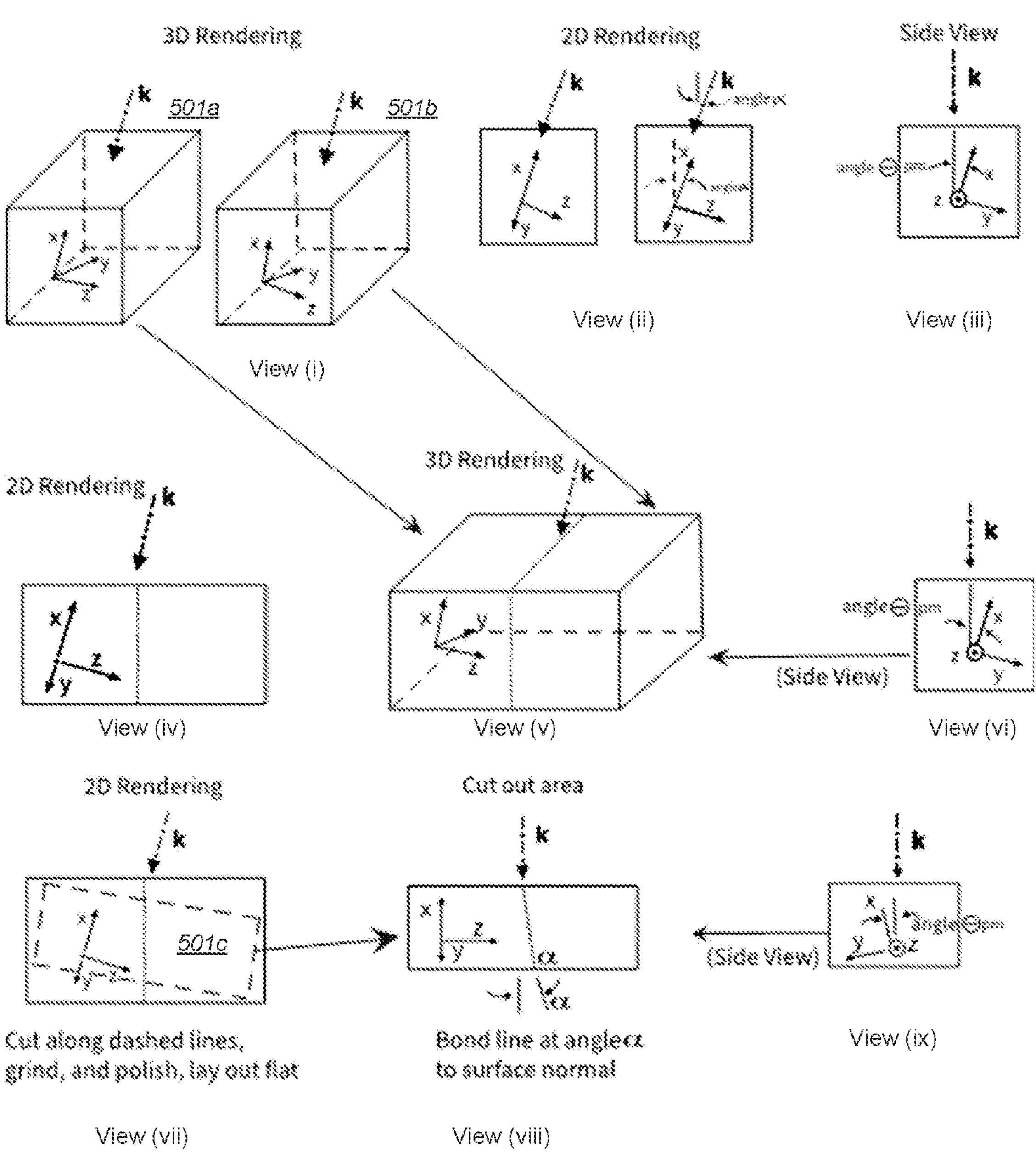
FIG. 5 illustrates producing angled bond lines according to another embodiment.

FIG. 5 illustrates producing angled bond lines according to another example embodiment. The bonding approach illustrated in FIG. 5 yields a similar result to that in FIG. 4, but starting with optical crystal parts 501*a* and 501*b* that are rectangular in all cross sections; none may be trapezoidal, for example. This may make the parts easier to hold during bonding, for example, and may be ultimately less expensive.

Views (i)-(iii) at the top of FIG. 5 shows a pair of LBO pieces before bonding, as illustrated in both 3- and 2-dimensional renderings and side view (iii). The next views down, (iv)-(vi), are of the LBO pieces after bonding. In all the views (i)-(vi), the input wave vector k is tilted over at the phase matching angle, $\theta_{PM}$, after it has entered the part. In order for the light to enter at near-normal incidence, as is often desirable, the part may be cut along the dashed lines shown in view (vii), which yields the final shape shown views (viii) and (ix). For example, here, a rotated rectangular sub-cube 501*c* is cut from the diffusion bonded optical crystal materials 501*a* and 501*b* so that the diffusion bond is angled between opposite parallel surfaces of the diffusion bonded composite optical crystal material. Some material is lost, but the aperture may remain wider than that of either of the original parts.

Figure 6:
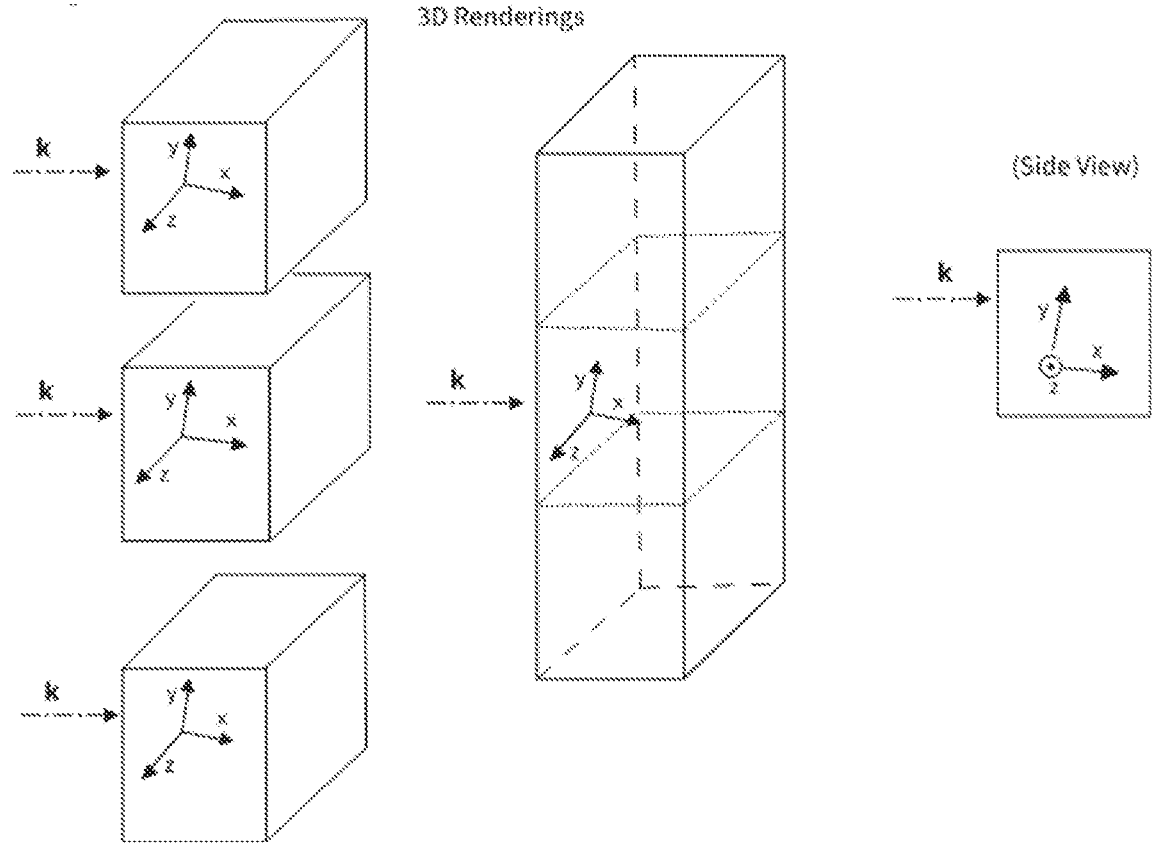
FIG. 6 illustrates diffusion bonding three (3) or more nonlinear optical components into one diffusion bonded optical component according to another embodiment.

FIG. 6 illustrates diffusion bonding three (3) or more nonlinear optical components into one diffusion bonded optical component according to another embodiment. This may be done in a single diffusion bonding step that is otherwise similar to the bonding process starting with two parts shown above in FIG. 2, for example. Alternatively, three or more parts may be bonded in series (e.g., a line) using a succession of single bonding steps between two LBO pieces, as was show in FIG. 2, for example.

Figure 7:
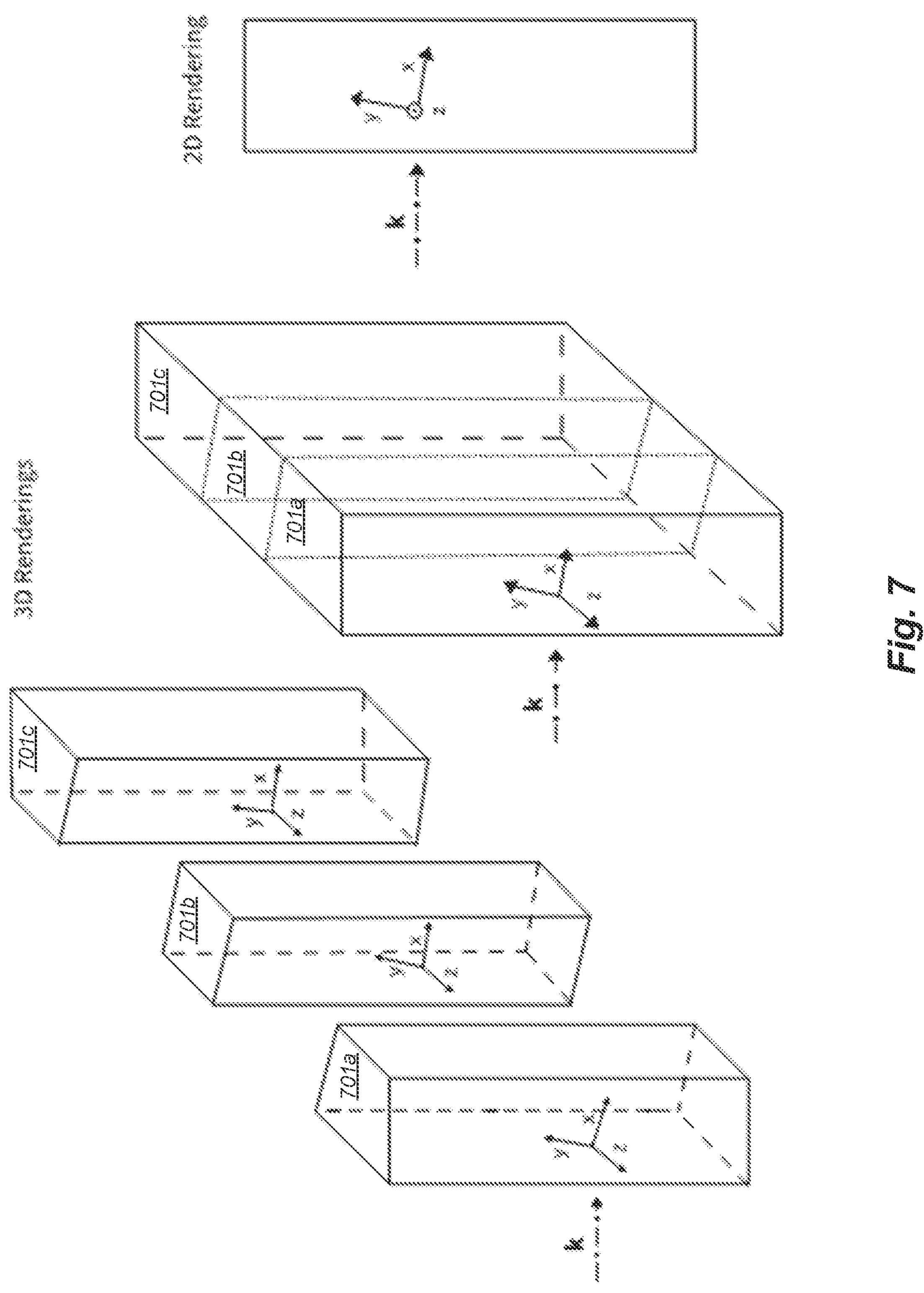
FIG. 7 illustrates bonding along multiple dimensions according to another embodiment.

FIG. 7 illustrates bonding along multiple dimensions according to another embodiment. In various embodiments, diffusion bonding of optical crystal materials may be performed to increase an aperture or length, or both, of an optical crystal. For example, in some embodiments, bonding along additional dimensions may result in an aperture that can scale in 2 dimensions by bonding parts bonded along one dimension into larger parts bonded along another dimension. While the examples shown herein illustrate certain shapes and arrangements, it is to be understood that many shapes may be used for individual parts, which is come cases may form mosaics of optical crystal materials with contacting surfaces (patterns of different shapes that may repeat, e.g., a rectangular mosaic that is potentially seamless). The bonding in this step starts with long LBO pieces 701*a-c* that each themselves have been formed by bonding smaller parts, as was described above, for example. Bond lines on the long pieces 701*a-c* are not shown here. The long pieces 701*a-c* may be shaped following the methodology of FIG. 4, for example, so the cross section of the piece in the middle 701*b* is a parallelogram and the others, 701*a* and 701*c* have trapezoidal cross sections with surfaces that can be brought into coplanar contact with the surfaces of piece 701*b*, for example. The three (3) pieces 701*a-c* are then bonded to make one large LBO piece. In general, this approach may alternatively be done starting with 2 parts or with more than 3 parts. Alternatively, this bonding step could also be done with all rectangular pieces as in FIG. 5 (e.g., where the composite piece may be cut after bonding). Also alternatively, 3 or more pieces could simply be bonded in a line using a succession of single bonding steps between two pieces, as was show in FIG. 2.

After each of the bonding steps, the surfaces that are distorted by the high temperature of the diffusion bonding cycle may be ground and polished. The techniques described herein provide an optimized bonding process where the bond lines do not need to be avoided by or shadowed from the transmitted laser beam to prevent localized distortion. Thus, the final piece results from a multistep bonding process in which many LBO pieces can be bonded. Furthermore, this process may be used for other nonlinear optical crystal materials such as (but not limited to) beta barium borate (BBO).

For the various bonding processes described herein, the first step is that the surfaces to be bonded may be polished in preparation for bonding, typically with a 0-0 scratch-dig surface quality and a lambda/10 (at 633 nm) wavelength flatness.

Figure 8A:
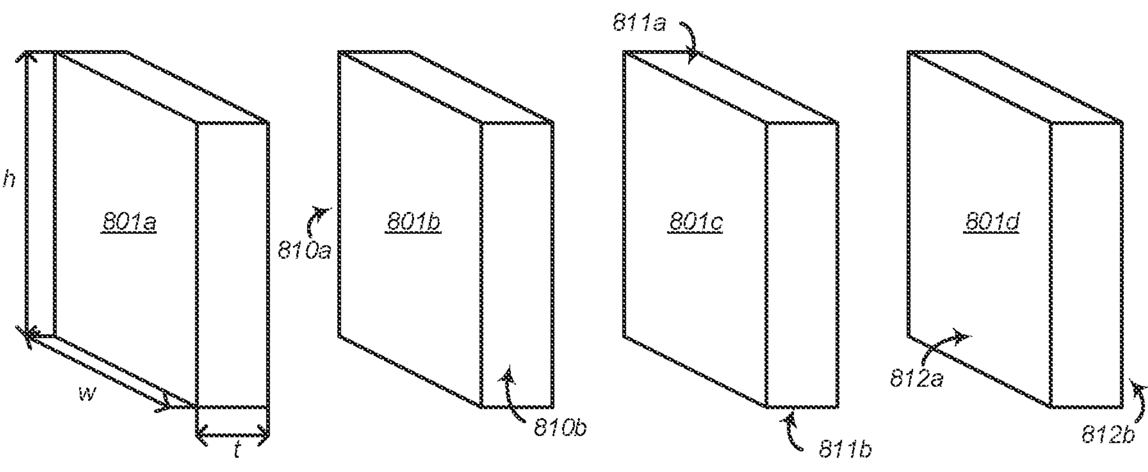
FIG. 8A illustrates optical crystal materials used to form a composite optical crystal material according to an embodiment.
Figure 8B:
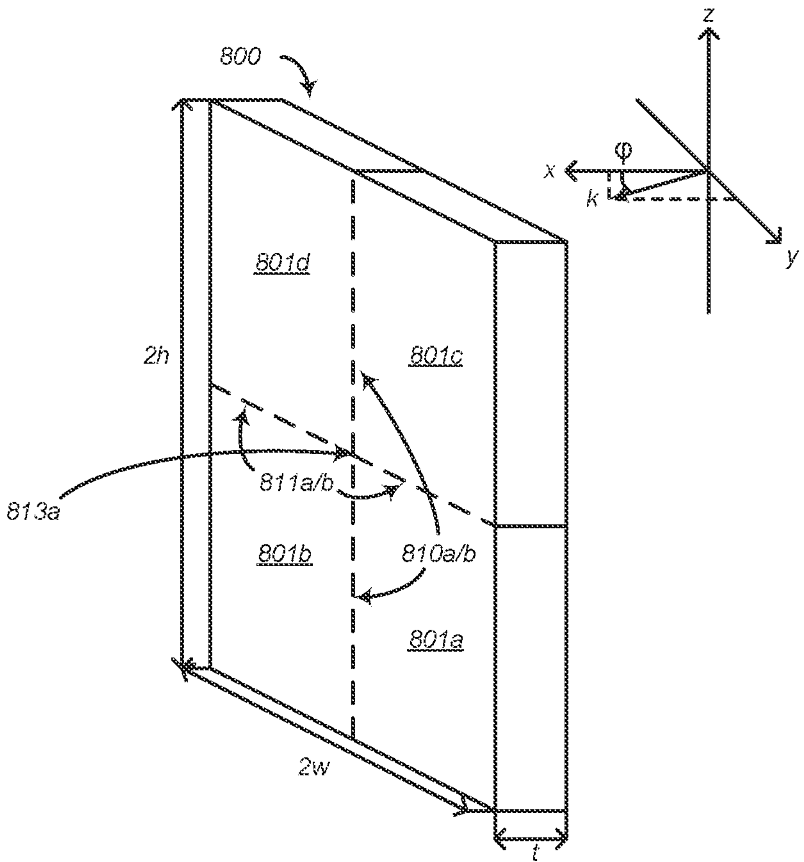
FIG. 8B illustrates a composite optical crystal material according to an embodiment.

FIGS. 8A and 8B illustrates optical crystal materials used to form a composite optical crystal material according to an embodiment. First, the optical crystal materials 801*a-d* in FIG. 8A are aligned. For example, a crystal orientation (e.g., directions of the x,y,z-axes) of each piece (before or after cutting) may be analyzed using X-ray orientation (e.g., by detecting angles of deflection of X-rays off a piece of crystal). One example approach is to orient the crystal and fabricate it into a rectangular solid, where each of the crystal's x, y, and z axes are perpendicular to faces of the starting fabricated part, for example. Later in the process described here, a larger crystal piece may be cut into two or more optical crystal materials 801*a-d*, for example.

In this example, optical crystal materials 801*a-d* in FIG. 8A are heated to bond and form a composite optical crystal material 800 in FIG. 8B. In some embodiments, optical crystal materials 801*a-d* are cut from the same crystal boule. For example, a crystal boule is a single-crystal ingot produced by synthetically, typically starting with a seed crystal, for example, whereupon additional crystal material is deposited by immersing the seed crystal in a melt of the material. In other embodiments, optical crystal materials 801*a-d* are cut from multiple different crystal boules, for example. In this example, each optical crystal material 801*a-d* has a same material type (e.g., LBO or BBO), a plurality of planar surfaces, and a same crystal orientation relative to the planar surfaces. For example, optical pieces 801*a-d* may be rectangular with opposite parallel surfaces 810*a-b*, 811*a-b*, and 812*a-b*, for example. The crystal orientation of optical crystal materials 801*a-d* are aligned (e.g., to within a tolerance). Optical crystal materials according to various embodiments may comprise surfaces formed along various dimensions, which may or may not be orthogonal. As illustrated in FIG. 8A, each of the plurality of optical crystal materials 801*a-d* comprises 3 orthogonal dimensions, namely, a height (h), a width (w), and a thickness (t). In various embodiments, the height and/or the width is greater than the thickness. Accordingly, surface areas for a composite optical crystal material may be greater than surface areas of component optical crystal materials, for example. Here, h and w are both greater than t.

Pieces 801*a-d* may be aligned and diffusion bonded to produce composite piece 800. For example, a planar surface (e.g., 812*a* of 801*c*) one optical crystal material is aligned with a planar surface (e.g., 812*a* of 801*c*) of another optical crystal material, for example, and the planar surfaces of optical crystal materials form a composite surface greater than any one of the plurality of planar surfaces of individual component pieces. In FIG. 8B, 4 surfaces are aligned to form a composite surface 813*a* larger than the component surfaces. During diffusion bonding, for example, two or more pieces to be bonded may be pushed together such that polished, commonly oriented surfaces are optically contacted together (e.g., by Van der Waal forces) so they "stick" together when they are brought together. The polished surfaces are cleaned and shaped complementary so there is virtually no gap between the polished surfaces of the crystals. Accordingly, alignment occurs when they naturally stick together. Then the contacted pairs go through temperature annealing where the atomic diffusion happens across the contacted plane. In some embodiments, a simple L bracket may be used to help guide the 2 pieces together. Once they are contacted, the alignment is set. Accordingly, one or more planar surfaces of each optical crystal material along the thickness t and one or more of the height or width (e.g., 810a/b and/or 811a/b) are diffusion bonded with another planar surface of another optical crystal material of the plurality of optical crystal materials along the thickness and one or more of the height or width (e.g., 810a/b and/or 811a/b). This is illustrated in FIG. 8B, where diffusion bonds are formed between surfaces along thickness and width and thickness and height, for example. The result is composite optical crystal material 800 comprising opposing parallel planar surfaces (e.g., 4 times 812a/b) having a surface area greater than a surface area of each of the plurality of planar surfaces of the plurality of optical crystal materials 801a-d. The result may be an increased aperture size, for example for light to enter. In this example, a light k-vector is in the xy-plane, with theta equal to 90 degrees and phi equal to 11 degrees (inside the crystal), and the crystal is oriented normal to the aperture surface. Advantageously, in this example, a height of the composite piece 800 is 2h, the width is 2w, and the total surface area is 4 times the surface area of the component pieces 801a-d (e.g., 4× the aperture size). In some example embodiments, pieces 801a and 801b are diffusion bonded, pieces 801c and 801d are diffusion bonded, and then bonded piece 801a/b is diffusion bonded to bonded piece 801c/d. However, different ordering and combinations of the bonding may occur.

Figure 8C:
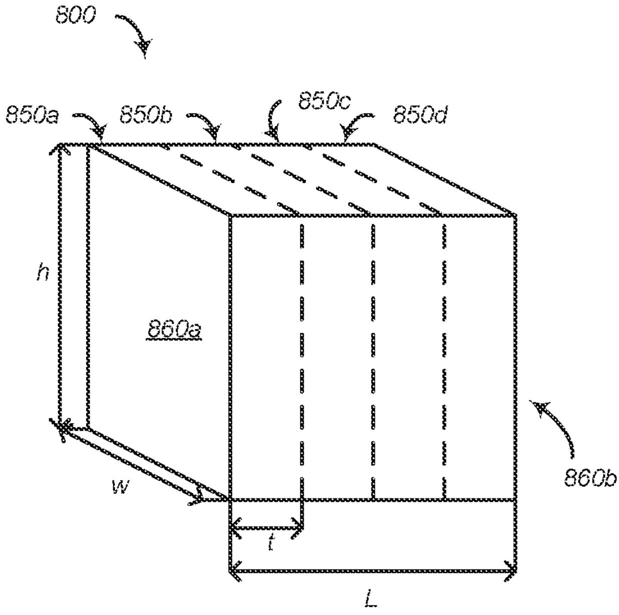
FIG. 8C illustrates a technique for producing multiple optical crystal materials according to an embodiment.

FIG. 8C illustrates a technique for producing optical crystal materials 801a-d according to an embodiment. In this example, an optical crystal material (e.g., an initial block or bulk material) comprises a plurality of parallel surfaces to form a rectangular or square cube. Fabricating precisely parallel surfaces may advantageously be simpler than making other specified angles between surfaces because optical interferometry can be used to precisely measure the parallelism between parts, for example, and measurement may be the limiting factor in precision optical fabrication. However, the flat planar surface arrangement illustrated here is merely one example. It is to be understood that other surfaces could be used. The planar surface 860a of the part on the left-hand side of the drawing is an exit or entrance face for the optical beam. The opposite side 860b on the right-hand side of the drawing is parallel to the side 860a on the left, and it is also an optical entrance or exit surface.

Some embodiments of the present disclosure perform a plurality of cuts of an optical crystal material (e.g., a block or bulk material 800 as shown in FIG. 8C) having a height and a width to separate the optical material into a plurality of optical crystal materials to be diffusion bonded. The material 800 may be formed and cut prior to heating and diffusion bonding, for example. In this example, an optical crystal material 800 may be cut into four segments (component parts) 850a-d that will be diffusion bonded later, so the aperture of the bonded final part increases by about a factor of about 4 in this example (as illustrated in FIG. 8B). First, the starting fabricated part is cut in planes along the dashed lines that are shown. If this starting part has dimensions height (h) by width (w) by length (L), then the component parts 850a-d have a thickness, t, equal to about L/4 by w by h. The thickness of each piece is a little less than L/4 because some material is lost in the cutting, grinding, and polishing of the surfaces, for example. If the fabricated starting part 800 shown here is larger rather than smaller, then fewer bonding and cutting steps may be required to reach a given target aperture, for example. In some example embodiments, each time a part is cut, it may be followed by grinding and polishing operation, so it may be advantageous to proceed without an excessively large number of bonding steps.

In the examples illustrated in FIG. 8A-C, component optical crystal material parts 801a-d may be made from the starting part 800 by cutting the starting part 800 into four component pieces (e.g., pieces 850a-d in FIG. 8C). It is to be understood that the number of pieces is not limited to four parts. Six, eight, ten, or other numbers of component optical crystal material parts could be used, for example. Further, the parts need not each be square in cross section (aperture). With an even number of parts, the resulting bonded composite part may be a rectangle, for example, but a rectangular aperture is not required of this technique. For example, a rectangular or non-rectangular bonded part could be cut to another shape such as a different size rectangle, a circle, an ellipse, etc.

Figure 9A:
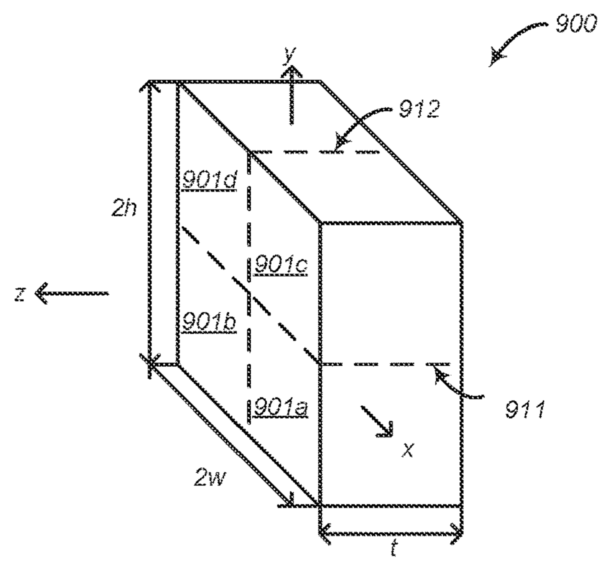
FIG. 9A illustrates optical crystal material used to form a composite optical crystal material according to another embodiment.
Figure 9B:
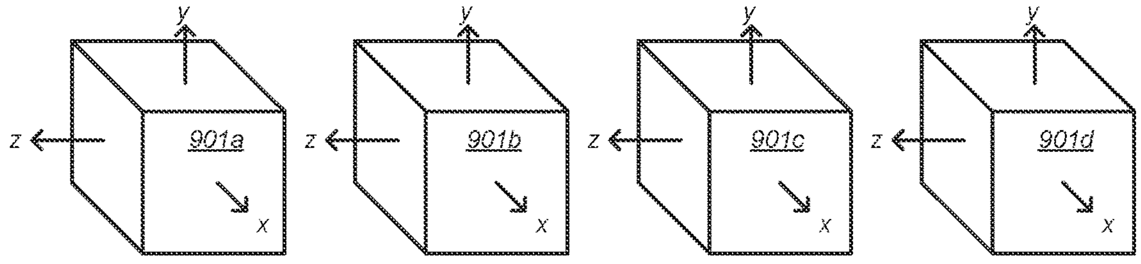
FIG. 9B illustrates optical crystal materials used to form a composite optical crystal material according to another embodiment.
Figure 9C:
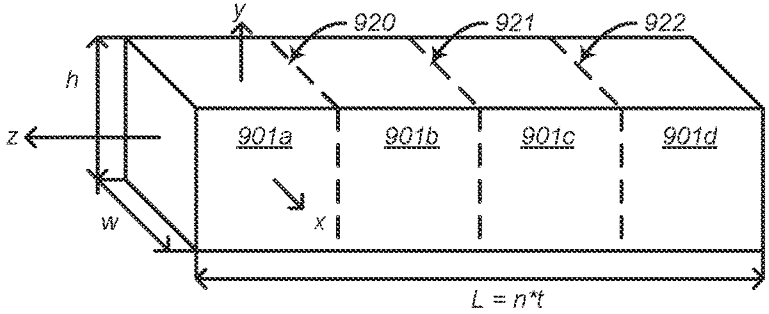
FIG. 9C illustrates a composite optical crystal material according to an embodiment.

FIGS. 9A-C illustrate diffusion bonding optical crystal materials to increase a length. For example, BBO may be used as an optical switch. For optical switch applications, it may be advantageous to increase the length of the single optical crystal. FIG. 9A illustrates optical crystal material 900 used to form a composite optical crystal material according to another embodiment. In this example, optical crystal 900 may be cut along the x-axis (cut 911) and the y-axis (cut 912) to produce individual optical crystal materials 901a-d, for example. The z-axis of the crystal is perpendicular to the surface on the left and right in the figure. The initial crystal material 900 has a height 2h, width 2w, and thickness t. FIG. 9B illustrates optical crystal materials 901a-d used to form a composite optical crystal material according to another embodiment. In this example, optical crystal materials 901a-d are produced by cutting optical material 900. However, it is to be understood that pieces 901a-d could be produced from different starting pieces 900 that are from the same or different boules, for example. FIG. 9C illustrates a composite optical crystal material according to an embodiment. Here, the optical crystal materials 901a-d are diffusion bonded so that a length of the diffusion bonded composite optical crystal material is greater than the height, the width, and the thickness (e.g., of each piece 901a-d and/or of the uncut material 900). Diffusion bond lines are illustrated using dashed lines at 920, 921, and 922. In this example, the length, L, is equal to n*t, where n is the number of pieces being bonded (here, n=4) and t is the thickness of both uncut material 900 and the individual pieces 901a-d. In one embodiment, the composite diffusion bonded optical crystal material is used as an electro-optic modulator. A beam of light travels down the z-axis (e.g., the k-vector is parallel to the z-axis). Electrodes may be formed on two opposing faces perpendicular to the x-axis, for example, and coupled to voltages. When the voltage is in one state, the optical beam passes through the composite material 950 with its polarization unaltered, and when the voltage is in another state, the optical beam passes through the composite material 950 with its polarization altered (modulated), and with a polarization analyzer (a polarizer) added this device becomes an intensity modulator, for example.

For the composite part in FIG. 8B, the k vector crosses the bond plane between what were component parts 801a/b and crosses the bond plane between what were component parts 801c/d both at the phase matching angle, phi, which in this case is 11°. Accordingly, the k vector, in some crystal orientations, may go directly down the bond plane between what were component parts 801*b/d* and 801*a/c*. Note also that when fabricated, as shown, these two planes (between 801*b/d* and 801*a/c*) may be as coplanar as possible, an extension of one another. However, in some embodiments the bond planes may be advantageously nearly invisible to the light waves. To do this, the bond planes may be configured so that the beam does not propagate directly down any of the bond planes. To make a two dimensional mosaic, the bond planes may be in crossing dimensions. They may not be precisely perpendicular to each other. Features and advantages of some embodiments orient the beam so it is not parallel to any of the bond planes, while still being oriented for phase matching, for example.

Figure 10:
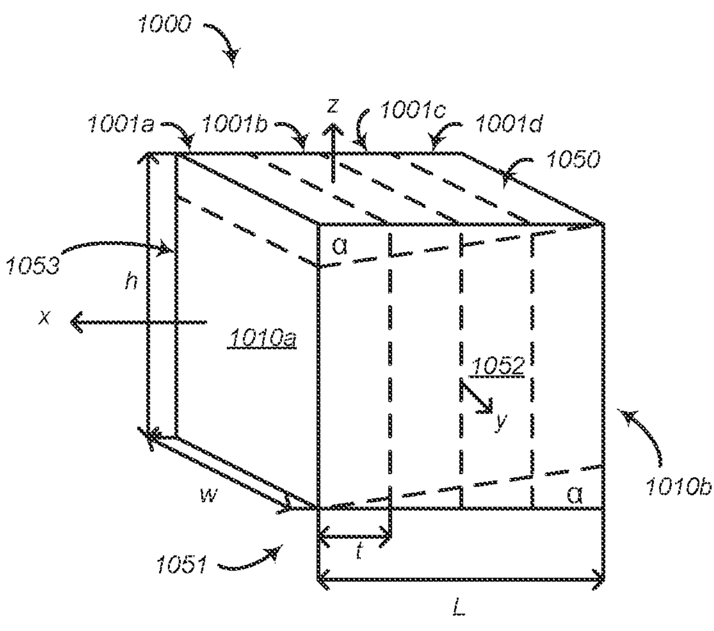
FIG. 10 illustrates an example technique for making optical crystal materials used to form a composite optical crystal material according to another embodiment.

FIG. 10 illustrates an example technique for making optical crystal materials used to form a composite optical crystal material according to another embodiment. FIG. 10 illustrates a technique to produce a diffusion bonded optical crystal material such that the k-vector of the beam does not go down the bond planes in either dimension. In some embodiments, diffusion bonds between a planar surface of an optical crystal material and the planar surface of another optical crystal material are angled relative to opposing parallel planar surfaces of a composite optical crystal material. Accordingly, when the optical crystal materials are diffusion bonded, the optical crystal material pieces form an angled bond line relative to input and/or output surfaces. For example, FIG. 10 may, in some example embodiments, be a starting fabricated part similar to FIG. 8C, where each side is initially a planar surface parallel to the opposite side. In this example, an angle, a, may be cut, ground, and/or polished on surface 1050 (here, the top) of starting piece 1000. Accordingly, surfaces 1050 and 1051 are angled relative to one or more other opposing parallel surfaces (e.g., surfaces 1052/1053 and/or 1010*a*/1010*b*). The larger the angle ($\alpha$), the greater the beam area over which the bond is advantageously spread. However, the larger the angle, the more material is lost in cutting the part to that angle, which is generally more costly. Accordingly, in various embodiments, the angle may be between 0.25 degrees and 45 degrees, for example. After forming the angle, $\alpha$, on side 1050, angle $\alpha$ may be cut, ground, and/or polished on an opposite side 1050 (here, the bottom) parallel to opposite side 1050 where angle $\alpha$ formed. Accordingly, a side view of the optical crystal material 1000 along one dimension may form a parallelogram, for example.

Figure 11:
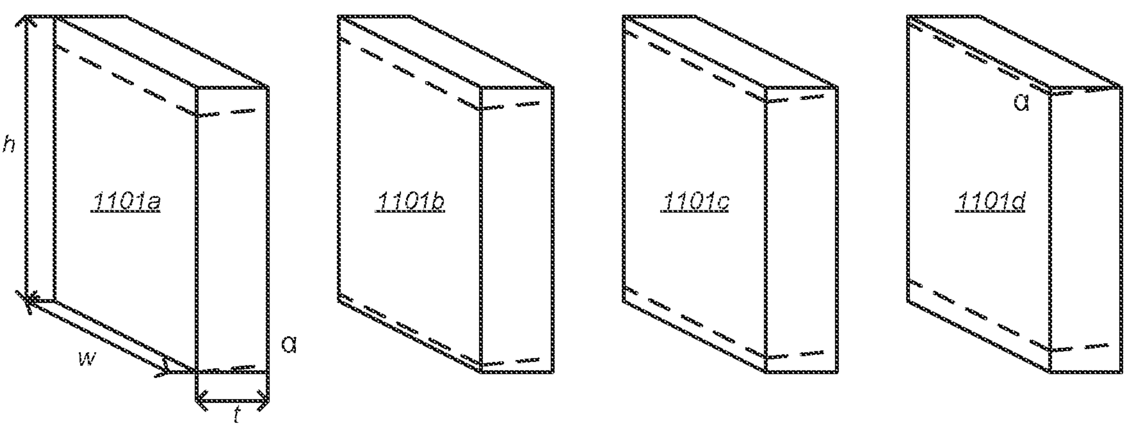
FIG. 11 illustrates optical crystal materials used to form a composite optical crystal material according to another embodiment.
Figure 12:
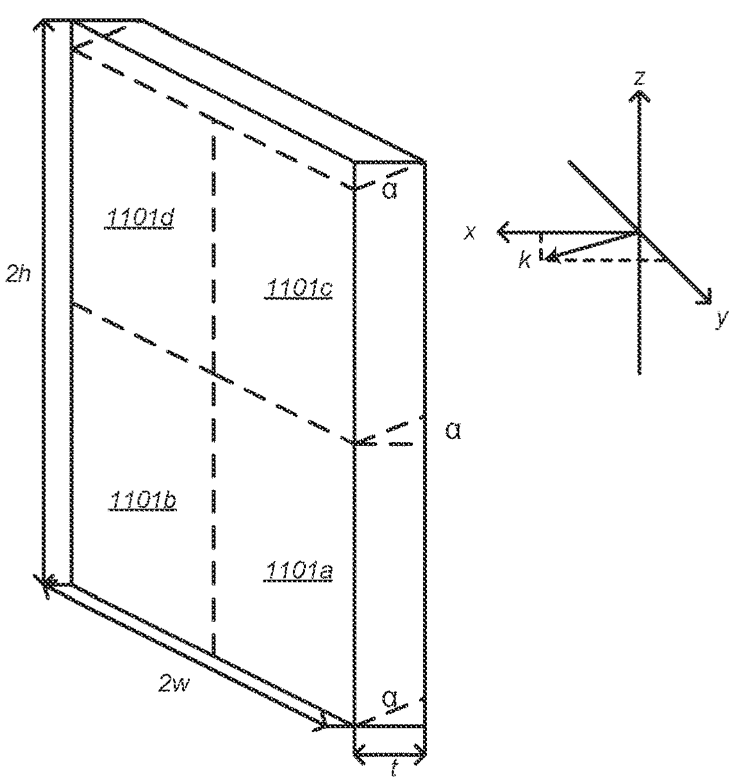
FIG. 12 illustrates an example composite optical crystal material according to an embodiment.

Component parts are illustrated in FIG. 11. For example, the optical crystal material 1000 of FIG. 10 may be cut, ground, and polished from an initial part (solid lines in FIG. 10) to form a fabricated parts 1101*a-d* (dashed lines in FIG. 10). These component optical crystal materials 1101*a-d*, produced from the same or different starting parts, are to be diffusion bonded so none of the bond planes will be parallel to the k vector along any crystal axis, for example. FIG. 11 illustrates optical crystal materials used to form a composite optical crystal material according to another embodiment. In FIG. 11, each component optical crystal part has an angled top and bottom surface. These can then be bonded into groups (pairs in this example) and then those groups can be again bonded to make a 2-dimensional mosaic, as shown in FIG. 12. Referring to FIG. 12, the k-vector of beam propagation is at an angle to the bond plane between pieces 1101*b/d* and 1101*a/c* (illustrated as a vertical dashed line). However, the polarization of the light along the z-axis is in the same direction as one of the bond planes. The introduced angle, $\alpha$, results in no bond plane being parallel to the beam. In this example, light can go through the material at the phase matching angle and not go directly down any bond planes. While the bond planes between the optical crystal materials may be substantially invisible to the light, the above example illustrates that in some cases bond plane may be discovered by adjusting the angle of the light until a measurable change in the output light occurs due to the light running parallel to the bond plane, for example.

Figure 13:
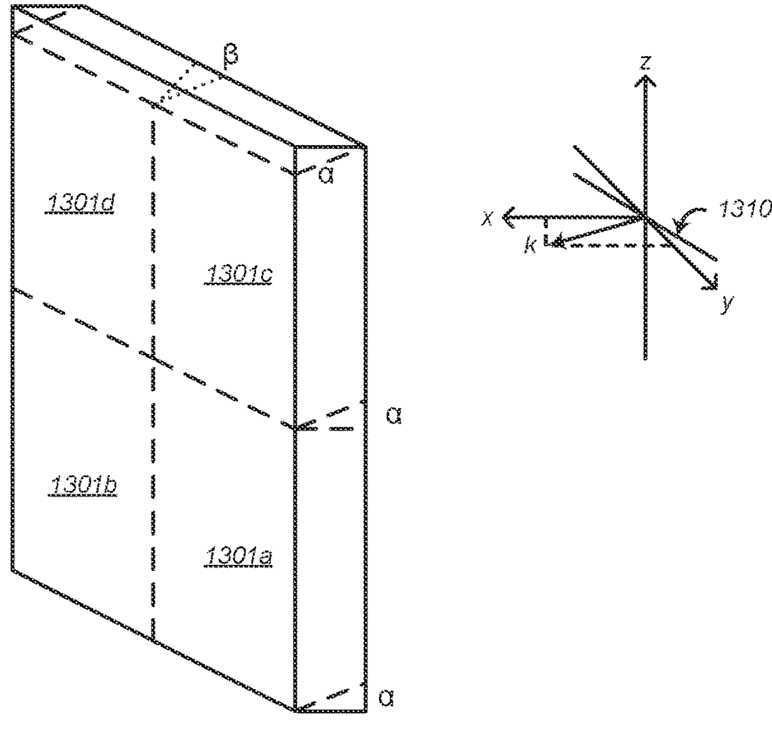
FIG. 13 illustrates an example composite optical crystal material according to another embodiment.
Figure 14:
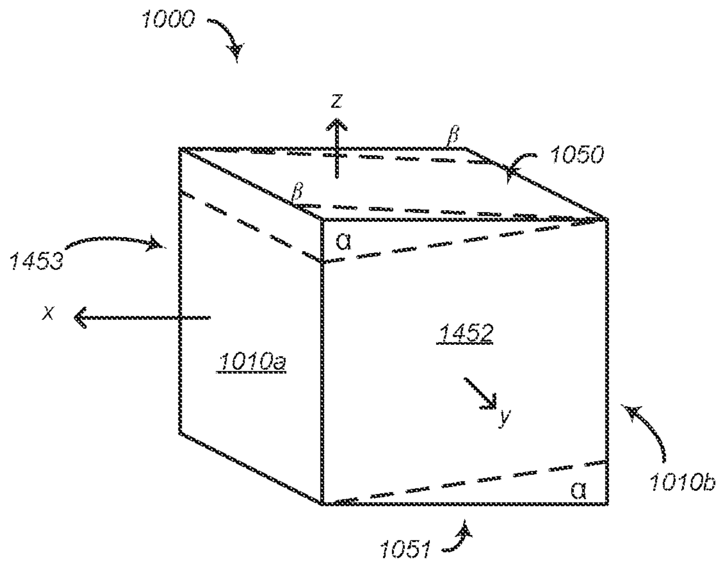
FIG. 14 illustrates another example technique for making optical crystal materials used to form a composite optical crystal material according to an embodiment.

In some embodiments, it may be desirable to change to direction of the k vector within the crystal with respect to the surface-normal. In this case, the crystal orientation may be changed such that the x-axis is not normal to the input/output surfaces as illustrated in FIG. 13, where the crystal orientation has been rotated such that the x-axis is not normal to the input surface. However, the phase matching angle must still be the same. Accordingly, the bonding surfaces may be cut at a non-perpendicular angle with respect to the x axis to change the direction of the k vector within the crystal with respect to the surface-normal when the beam is going through the crystal phase-matched. The motivation for this is that if the beam is far off-normal then the aperture is effectively reduced and there may be other considerations such as making coatings more difficult. Accordingly, it may be desirable to change the orientation of the crystal axes relative to the input/output surface normals to have a k-vector at different angles relative to the surface to maximize the aperture and/or other system parameters. Referring to FIG. 14, an additional angle, $\beta$, may be applied to surfaces 1052 (front) and 1053 (back), which are initially perpendicular to the y axis in the fabricated component part 1000. For example, an additional portion of optical crystal material may be removed to form a third angled surface 1452 and a fourth angled surface 1453. In this example, the third angled surface 1452 is parallel to the fourth angled surface 1453. Call the angle applied to the part to be "$\beta$" so both faces that were initially perpendicular to the y axis may be cut, ground, and/or polished, to produce an angle $\beta$ with respect to the y-axis. These surfaces, when bonded later, change the angle with respect to the bond plane of the beam inside the material from the phase matching angle ($\theta pm$) to ($\theta pm-\beta$), or if angled the other direction ($\theta pm+\beta$). If an angle between the phase-matched beam's k vector and the bond plane of 4 degrees is desired, for example, then $\beta$ should equal 7 degrees with $\theta pm=11$ degrees.

Figure 15:
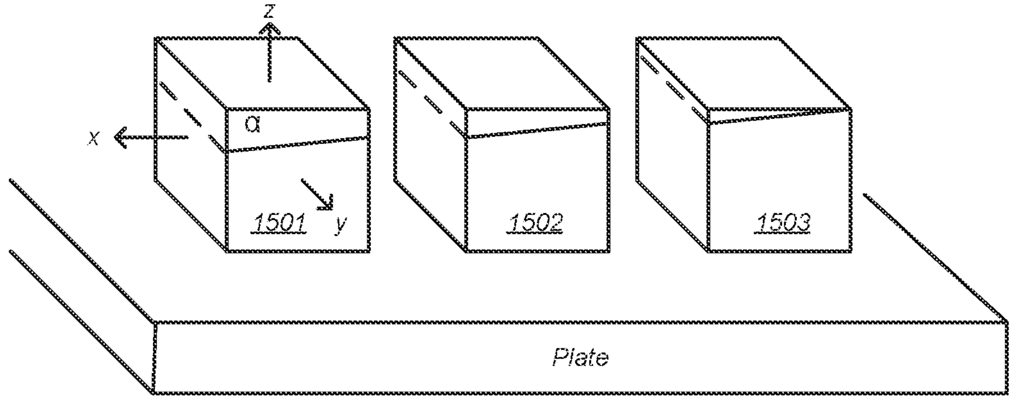
FIG. 15 illustrates yet another example technique for making optical crystal materials used to form a composite optical crystal material according to an embodiment.

In some embodiments, component parts are optimized so they are all nearly identical, including nearly identical crystal orientation, even without them all being cut from a common fabricated starting part. For example, in some embodiments removing a portion of optical material is performed individually on a plurality of optical crystal materials (e.g., after being cut as illustrated in FIG. 8C). This flexibility may be advantageous if many component parts are to be made. One approach to this is shown in FIG. 15 where three optical crystal parts 1501-1503 are shown by way of example. Parts 1501-1503 may be from the same boule or different boules, for example. As before, in this figure the material was cut, ground and polished from an initial part (solid lines) to a fabricated part (dashed lines). The three parts are fabricated so they are all of similar form, and they have the same crystal orientation. In this example the x, y, and z axes are perpendicular to surface faces of the parts. The parts shown can then be ground and polished, for example, to be diffusion bonded using the methods described earlier, and if an angle, $\alpha$, is put on the parts as shown, and then the opposite faces are polished parallel to the face that is now at angle $\alpha$, then the parts can be bonded without having the k vector go down the bond plane. If four such component parts are made, the bonded 2×2 mosaic shown in FIG. 12 can be made, and with more component parts this approach can be extended to larger mosaics to make larger composite optical crystal material structures, for example.

Accordingly, in various embodiments (e.g., as shown in FIGS. 10, 11, 12, 13, and 15) a portion of optical crystal material may be removed from the optical crystal materials (e.g., in bulk as in FIG. 10 or individually in FIG. 15) to form a first angled surface and a second angled surface, wherein the first angled surface and the second angled surface are along one dimension (e.g., a thickness) of the first optical crystal material. Using this technique, the input light may not be parallel to the diffusion bond plane in any direction, for example. In some embodiments, as illustrated in FIGS. 13 and 14, an additional portion of optical crystal material may be removed from the plurality of optical crystal materials to form a third angled surface and a fourth angled surface, wherein the third angled surface is parallel to the fourth angled surface.

Figure 16:
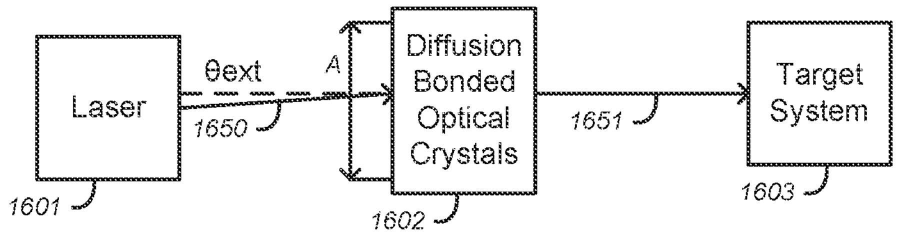
FIG. 16 illustrates one example application of the techniques described herein according to various embodiments.

FIG. 16 illustrates one example application of the techniques described herein according to various embodiments. In one embodiment, the present techniques may be used in an apparatus comprising a laser 1601 configured to generate a beam of light 1650 having a first frequency. The apparatus may comprise a composite optical crystal material 1602 comprising a plurality of diffusion bonded optical crystal materials as described herein. The composite optical crystal material 1602 receive the beam of light (e.g., inside the diffusion bonded crystals) at a phase matching angle to generate light 1651 having a second frequency. To achieve phase matching, light 1650 may be incident to an aperture, A, at an angle θext, however, as mentioned above phase matching angles are relative to the internal orientation of the crystal axes. Advantageously, aperture A may be increased using the techniques described herein. Accordingly, A is accentuated for illustrative purposes in FIG. 16. Laser 1601, generates beam of light 1650 having the first frequency. Beam of light 1650 is coupled an input planar surface of a composite optical crystal material, which comprises a plurality of diffusion bonded optical crystal materials to produce an increased aperture size. The composite optical crystal material receive the beam of light (e.g., inside the crystal) at a phase matching angle to generate light having a second frequency 1651. The beam of light having the second frequency 1651 is output from a second planar surface of the composite optical crystal material. Beam of light 1651 may be coupled to a target system 1603. One example target system is a nuclear fusion system, for example.

Figure 17:
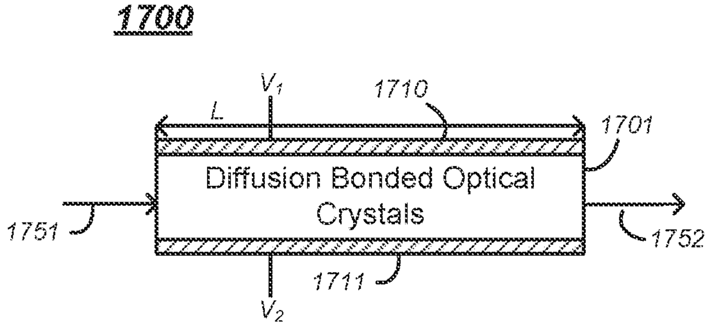
FIG. 17 illustrates another example application of the techniques described herein according to various embodiments.

FIG. 17 illustrates another example application of the techniques described herein according to various embodiments. This example illustrates an optical switch (aka, electro-optic switch or light valve) 1700. Optical switch 1700 comprises diffusion bonded optical crystals as described herein to increase a length of the optical switch 1700. Optical switch 1700 further comprises conductors 1710-1711 (e.g., an anode and cathode). Conductor 1710 is coupled to a first voltage (V1) and conductor 1711 is coupled to a second voltage (V2). In some embodiments, the diffusion bonded optical crystals are BBO crystals. In this example, a refractive index of the crystals depends on a voltage applied across the conductors. If polarized light (e.g., 45 degrees off vertically polarized) enters the optical switch, the light's polarization can be changed, and thus the beam intensity can be blocked when passed through a polarizer after the crystal (not shown) based on the voltage between V1 and V2, for example. Advantageously, the diffusion bonded optical crystals may increase the length L of the optical switch, which improves the performance of the switch by increasing the sensitivity of the device to voltage (e.g. requiring less voltage to modulate), for example.

Figure 18:
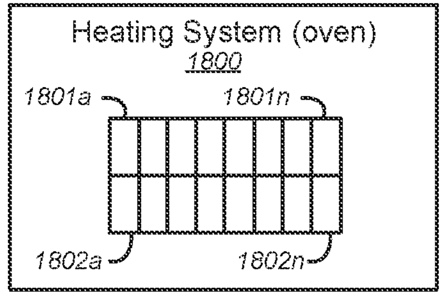
FIG. 18 illustrates an example process of making diffusion bonded crystals according to an embodiment.

FIG. 18 illustrates another example embodiment. In this example, a heating system 1800 (e.g., an oven) receives a plurality of optical crystal materials 1801*a*-*n* and 1802*a*-*n*, including at least a first optical crystal material 1801*a* and a second optical crystal material 1802*a*, having a same material type. The optical crystal materials 1801*a*-*n* and 1802*a*-*n* each have a crystal orientation and a plurality of planar surfaces (e.g., flat planar surfaces). Optical crystal materials 1801*a*-*n* and 1802*a*-*n* are positioned so that planar surfaces are in contact, including at least the first planar surface of the first optical crystal material is in contact with a first planar surface of the second optical crystal material. Additionally, the crystal orientation of the optical crystal materials 1801*a*-*n* and 1802*a*-*n* are aligned. Further, heating systems 1800 heats optical crystal materials 1801*a*-*n* and 1802*a*-*n* to diffusion bond the contacting planar surfaces. For instance, the first planar surface of the first optical crystal material is heated and diffusion bonded with the first planar surface of the second optical crystal material.

FURTHER EXAMPLE EMBODIMENTS

Each of the following non-limiting features in the following examples may stand on its own or may be combined in various permutations or combinations with one or more of the other features in the examples below. In various embodiments, the present disclosure may be implemented as an apparatus or method.

In one embodiment, the present disclosure includes a diffusion bonded nonlinear optical device.

In one embodiment, the present disclosure includes a laser system, the laser system comprising: a laser and a plurality of diffusion bonded nonlinear optical materials.

In one embodiment, the present disclosure includes a fusion reactor including a laser system, the laser system comprising: a laser and a plurality of diffusion bonded nonlinear optical materials.

In one embodiment, the diffusion bonded nonlinear optical devices or materials are diffusion bonded LBO crystals.

In one embodiment, the diffusion bonded nonlinear optical devices or materials are bonded along planes forming an angle with an optical beam axis.

In one embodiment, light is coupled through the diffusion bonded nonlinear optical device or materials at an angle to a plane of one or more diffusion bonds between nonlinear optical materials.

In another embodiment, the present disclosure includes diffusion bonding of LBO or other optical materials, particularly nonlinear materials, to have the parts end-to-end, for example, to increase length.

In another embodiment, the present disclosure includes diffusion bonding of LBO or other optical materials, particularly nonlinear materials, with the bond angle intentionally skewed or tilted off the direction of the desired optical beam axis so as to keep the beam from going directly down the bond line, which may be tilted by more than 1 to less than 45 degrees. Advantageously, this could be 0.25 degrees to 25 degrees when the interest is bonding to increase aperture. For angles well less than the smallest end of this range the projection of the bond plane on the beam plane is only spread by small fractions of a millimeter when bonding parts that are millimeters to tens of millimeters thick. Angles of many tens of degrees will mean that substantial material is lost in angling the surfaces. In some cases, the angle is about 10 degrees, which is the angle to the light propagation that avoids traveling along the seam of the bond line, and which would generally appear as a striation in the beam. For some cases, a 10 degree bond angle may be a natural angle to bond, without any consideration to the issue of the beam going right down the bond, but rather it is the natural direction for the phase matching angle.

In one embodiment, the diffusion bonds are angled relative to a plane incident to an input wave (e.g., FIG. 4).

In another embodiment, rectangular nonlinear (e.g., LBO) optical materials are bonded and then re-cut at an angle (e.g., FIG. 5).

In one embodiment, nonlinear optical materials (e.g., LBO) are bonded in one bonding step in series (e.g., a linear row), for example, to increase the aperture predominantly in a direction perpendicular to the direction of the light which is intended to go through the bonded part.

In one embodiment, nonlinear optical materials (e.g., LBO) are bonded in two dimensions to increase aperture.

In one embodiment, a series (e.g., a linear row) of diffusion bonded nonlinear optical material is bonded in 2 dimensions with 3 or more diffusion bonded nonlinear optical material in one or both dimensions.

Diffusion Bonding of LBO as illustrated in FIG. 6 or other optical materials, particularly nonlinear materials as above in 2 directions done with building blocks of three or more parts.

Combining the approach of FIG. 5 or 6 with that of FIG. 2 displays how diffusion bonding can create a unified part of greater area and volume than any single piece Example 1: In one embodiment the present disclosure includes a method comprising: receiving, in a heating system, at least a first optical crystal material and a second optical crystal material having a same material type, wherein the first optical crystal material and the second optical crystal material each have a crystal orientation and a plurality of planar surfaces; positioning the first optical crystal material and the second optical crystal material so that a first planar surface of the first optical crystal material is in contact with a first planar surface of the second optical crystal material and the crystal orientation of the first optical crystal material is aligned with the crystal orientation of the second optical crystal material; and heating the first optical crystal material and the second optical crystal material to diffusion bond the first planar surface of the first optical crystal material with the first planar surface of the second optical crystal material.

Example 2: In one embodiment the present disclosure includes a method comprising: positioning a plurality of optical crystal materials having a same material type, wherein the plurality of optical crystal materials each have a crystal orientation and a plurality of planar surfaces, and wherein one or more planar surfaces of each optical crystal material are in contact with another planar surface of an adjacent optical crystal material, wherein the crystal orientation of the plurality of optical crystal materials are aligned; and heating the plurality of optical crystal materials to diffusion bond contacting planar surfaces of the plurality optical crystal materials.

Example 3: In one embodiment the present disclosure includes a method comprising: heating a plurality of optical crystal materials to form a composite optical crystal material, wherein each optical crystal material of the plurality of optical crystal materials comprises a same material type, a plurality of planar surfaces, and a same crystal orientation relative to the planar surfaces, wherein the crystal orientation of the plurality of optical crystal materials are aligned, wherein each of the plurality of optical crystal materials comprises a height and a width greater than a thickness, wherein one or more planar surfaces of each optical crystal material along the thickness and one or more of the height or width are diffusion bonded with another planar surface of another optical crystal material of the plurality of optical crystal materials along the thickness and one or more of the height or width, and wherein the composite optical crystal material comprises opposing parallel planar surfaces having a surface area greater than a surface area of each of the plurality of planar surfaces of the plurality of optical crystal materials.

Example 4: In one embodiment the present disclosure includes an apparatus comprising: a laser configured to generate a beam of light having at least a first frequency; and a composite optical crystal material comprising a plurality of diffusion bonded optical crystal materials, the composite optical crystal material receiving the beam of light at a phase matching angle to generate light having at least a second frequency.

Example 5: In one embodiment the present disclosure includes a method comprising: generating, in a laser, a beam of light having a first frequency; coupling the beam of light to a first planar surface of a composite optical crystal material, the composite optical crystal material comprising a plurality of diffusion bonded optical crystal materials, the composite optical crystal material receiving the beam of light at a phase matching angle to generate light having a second frequency; and outputting the beam of light having the second frequency from a second planar surface of the composite optical crystal material.

Example 6: In one embodiment the present disclosure includes an apparatus comprising: a laser; and diffusion bonded optical crystal material means for receiving light and producing an output light.

The embodiments of Examples 1-6 may each be combined with any one or more of the following Examples 101-150.

Example 101: In one embodiment, the plurality of optical crystal materials has a same material type.

Example 102: In one embodiment, the plurality of optical crystal materials each comprise a plurality of planar surfaces, and wherein one or more planar surfaces of each optical crystal material are in contact with another planar surface of an adjacent optical crystal material.

Example 103: In one embodiment, the plurality of optical crystal materials each have a crystal orientation, and wherein the crystal orientation of the plurality of optical crystal materials are aligned.

Example 104: In one embodiment, the first optical crystal material further comprises a second planar surface of the plurality of surfaces and the second optical crystal material further comprises a second planar surface of the plurality of surfaces, wherein when the first planar surface of the first optical crystal material is aligned with the first planar surface of the second optical crystal material, and wherein the second planar surface of the first optical crystal material and the second planar surface of the second optical crystal material form a composite surface greater than any one of the plurality of planar surfaces.

Example 105: In one embodiment, a cross sectional area of the diffusion bonded first optical crystal material and second optical crystal material is greater than a cross sectional area of the first optical crystal material and a cross sectional area of the second optical crystal material.

Example 106: In one embodiment, the first optical crystal material and the second optical crystal material each have a plurality of opposing parallel surfaces, and wherein the crystal orientation is normal to two or more of the parallel surfaces.

Example 107: In one embodiment, the first optical crystal material and the second optical crystal material each have a plurality of parallel surfaces, and wherein the crystal orientation is at an angle to at least two opposing parallel surfaces.

Example 108: In one embodiment, a diffusion bond between the first planar surface of the first optical crystal material and the first planar surface of the second optical crystal material is configured at an angle to at least one axis of light propagation for the crystal orientation of the first optical crystal material and the aligned crystal orientation of the second optical crystal material. In one embodiment, the angle is between 0.25 degrees and 45 degrees.

Example 109: In one embodiment, the crystal orientation of the first optical crystal material is aligned with the crystal orientation of the second optical crystal material within 80 arc seconds.

Example 110: In one embodiment, the crystal orientation of the first optical crystal material is aligned with the crystal orientation of the second optical crystal material within 40 arc seconds.

Example 111: In one embodiment, the first optical crystal material has a first crystal axis orientation and the second optical crystal material has a second crystal axis orientation aligned to the first crystal axis orientation during said heating.

Example 112: In one embodiment, further comprising determining the first crystal axis orientation for the first optical crystal material and the second crystal axis orientation for the second optical crystal material.

Example 113: In one embodiment, the first optical crystal material and the second optical crystal material are cut from a same crystal boules.

Example 114: In one embodiment, the first optical crystal material and the second optical crystal material are cut from different crystal boules.

Example 115: In one embodiment, said heating raises the temperature of the first optical crystal material and the second optical crystal material to a temperature less than the melting temperature of the crystal such that molecules of the first optical crystal material and the second optical crystal material become mobile and intermesh between the first planar surface of the first optical crystal material with the first planar surface of the second optical crystal material.

Example 116: In one embodiment, said heating raises the temperature of the first optical crystal material and the second optical crystal material to a temperature between 60% and 90% of the melting point of the first optical crystal material and the second optical crystal material.

Example 117: In one embodiment, further comprising, prior to forming the diffusion bond, polishing the first planar surface of the first optical crystal material and the first planar surface of the second optical crystal material.

Example 118: In one embodiment, said polishing produces a 0-0 scratch-dig surface quality and a reflected wavefront distortion within lambda divided by 10 at 633 nm.

Example 119: In one embodiment, the diffusion bond between the first planar surface of the first optical crystal material and the first planar surface of the second optical crystal material is offset from one or more crystal axes by an angle.

Example 120: In one embodiment, the diffusion bond between the first planar surface of the first optical crystal material and the first planar surface of the second optical crystal material is offset by an angle relative to light propagating in the first optical crystal material and the second optical crystal material.

Example 121: In one embodiment, the angle is between 0.25 degrees to 25 degrees.

Example 122: In one embodiment, the first optical crystal material comprises a height, a width, and a thickness, wherein the second optical crystal material comprises a same thickness and one or more of a same height or a same width as the first optical crystal material Example 123: In one embodiment, the first optical crystal material and the second optical crystal material are rectangular cubes.

Example 124: In one embodiment, one or more of the height and the width of the first optical crystal material is greater than the thickness, and wherein the first surface of the first optical crystal material is formed by one of the height or width and thickness of the first optical crystal material.

Example 125: In one embodiment, further comprising cutting a rotated sub-structure from the diffusion bonded first optical crystal material and second optical crystal material so that the diffusion bond is angled relative to at least one surface of the diffusion bonded first optical crystal material and second optical crystal material.

Example 126: In one embodiment, the first optical crystal material is diffusion bonded to the second optical crystal material so that at least one combined surface of the diffusion bonded first and second optical crystal materials is greater than the height, the width, and the thickness of the first optical crystal material and second optical crystal material.

Example 127: In one embodiment, the first optical crystal material is diffusion bonded to the second optical crystal material so that a length of the diffusion bonded first and second optical crystal materials is greater than the height, the width, and the thickness of the first optical crystal material and second optical crystal material.

Example 128: In one embodiment, at least one of the first optical crystal material and the second optical crystal material is trapezoidal.

Example 129: In one embodiment, the first optical crystal material and the second optical crystal material are nonlinear optical crystal materials.

Example 130: In one embodiment, the first optical crystal material and the second optical crystal material are Lithium triborate (LBO).

Example 131: In one embodiment, the first optical crystal material and the second optical crystal material are Beta barium borate (BBO).

Example 132: In one embodiment, the first optical crystal material and the second optical crystal material are combined to increase an aperture area.

Example 133: In one embodiment, the first optical crystal material and the second optical crystal material are combined to increase length.

Example 134: In one embodiment, the plurality of optical crystal materials is rectangular.

Example 135: In one embodiment, the plurality of optical crystal materials is trapezoidal.

Example 136: In one embodiment, the plurality of optical crystal materials is cut from a same crystal boule.

Example 137: In one embodiment, the plurality of optical crystal materials is cut from different crystal boules.

Example 138: In one embodiment, further comprising, prior to heating, performing a first plurality of cuts of a first optical crystal material having the height and the width to separate said plurality of optical crystal materials.

Example 139: In one embodiment, further comprising removing a portion of optical crystal material from the plurality of optical crystal materials to form a first angled surface and a second angled surface.

Example 140: In one embodiment, the second angled surface is parallel to the first angled surface.

Example 141: In one embodiment, said removing a portion of optical material comprises performing a plurality of cuts.

Example 142: In one embodiment, further comprising removing a second portion of optical crystal material from the plurality of optical crystal materials to form a third angled surface and a fourth angled surface, wherein the third angled surface is parallel to the fourth angled surface.

Example 143: In one embodiment, said removing a portion of optical material comprises grinding the first optical crystal material.

Example 144: In one embodiment, said removing a portion of optical material comprises polishing the first optical crystal material.

Example 145: In one embodiment, said removing a portion of optical material is performed on a single optical crystal material before performing a first plurality of cuts of the single optical crystal material to produce the plurality of optical crystal materials.

Example 146; In one embodiment, the second angled surface is parallel to the first angled surface.

Example 147: In one embodiment, said removing a portion of optical material is performed individually on the plurality of optical crystal materials.

Example 148: In one embodiment, one or more diffusion bonds between the one or more planar surfaces of each optical crystal material and the another planar surface of the another optical crystal material are angled relative to the opposing parallel planar surfaces of the composite optical crystal material.

Example 149: In one embodiment, the diffusion bonded optical crystal material means receives the light having at least a first frequency and outputs a light having at least a second frequency different from the first frequency.

Example 150: In one embodiment, the diffusion bonded optical crystal material means is part of an optical switch.

Note that certain feature, advantages, and concepts above were illustrated for LBO and second harmonic generation. However, it is clear to one of ordinary skill in the art that the same concepts apply to other linear or nonlinear optical crystal materials such as BBO, and they apply to wavelengths other than those mentioned in the examples. They also apply to other linear or nonlinear applications of these materials such as (but not limited to) other sum-frequency generation processes like third harmonic generation or fourth harmonic generation. They also apply to parametric processes like down-conversion and/or to electro-optic applications, for example.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A method comprising:

receiving, in a heating system, at least a first optical crystal material and a second optical crystal material having a same material type, wherein the first optical crystal material and the second optical crystal material each have a crystal orientation and at least one planar surface;

positioning the first optical crystal material and the second optical crystal material so that a first planar surface of the first optical crystal material is in contact with a first planar surface of the second optical crystal material, the first optical crystal material and the second optical crystal material forming an input surface, and the crystal orientation of the first optical crystal material is aligned with the crystal orientation of the second optical crystal material; and heating the first optical crystal material and the second optical crystal material to diffusion bond the first planar surface of the first optical crystal material with the first planar surface of the second optical crystal material, the diffusion bond forming a composite optical crystal material comprising the input surface, wherein the diffusion bond between the first planar surface and second planar surface is configured at an angle to a phase matched k-vector inside the composite optical crystal material.

2. The method of claim 1, wherein the first optical crystal material further comprises a second planar surface and the second optical crystal material further comprises a second planar surface, wherein when the first planar surface of the first optical crystal material is aligned with the first planar surface of the second optical crystal material, the second planar surface of the first optical crystal material and the second planar surface of the second optical crystal material form the input surface having a surface area greater than the second planar surface of the first optical crystal material and the second planar surface of the second optical crystal material.

3. The method of claim 1, wherein a cross sectional area along at least one dimension of the diffusion bonded first optical crystal material and second optical crystal material is greater than a cross sectional area along the at least one dimension of the first optical crystal material and a cross sectional area along the at least one dimension of the second optical crystal material.

4. The method of claim 1, wherein the crystal orientation is normal to the diffusion bond.

5. The method of claim 1, wherein the crystal orientation is at an angle to the diffusion bond.

6. The method of claim 1, wherein the angle is between 0.25 degrees and 45 degrees.

7. The method of claim 1, wherein the crystal orientation of the first optical crystal material is aligned with the crystal orientation of the second optical crystal material within 80 arc seconds.

8. The method of claim 1, wherein the crystal orientation of the first optical crystal material is aligned with the crystal orientation of the second optical crystal material within 40 arc seconds.

9. The method of claim 1, wherein the first optical crystal material has a first crystal axis orientation and the second optical crystal material has a second crystal axis orientation aligned to the first crystal axis orientation during said heating.

10. The method of claim 9, further comprising determining the first crystal axis orientation for the first optical crystal material and the second crystal axis orientation for the second optical crystal material.

11. The method of claim 1, wherein the first optical crystal material and the second optical crystal material are cut from a same crystal boules.

12. The method of claim 1, wherein the first optical crystal material and the second optical crystal material are cut from different crystal boules.

13. The method of claim 1, wherein said heating raises the temperature of the first optical crystal material and the second optical crystal material to a temperature less than the melting temperature of the crystal such that molecules of the first optical crystal material and the second optical crystal material become mobile and intermesh between the first planar surface of the first optical crystal material with the first planar surface of the second optical crystal material.

14. The method of claim 1, wherein said heating raises the temperature of the first optical crystal material and the second optical crystal material to a temperature between 60% and 90% of the melting point of the first optical crystal material and the second optical crystal material.

15. The method of claim 1, further comprising, prior to forming the diffusion bond, polishing the first planar surface of the first optical crystal material and the first planar surface of the second optical crystal material.

16. The method of claim 15, wherein said polishing produces a 0-0 scratch-dig surface quality and a reflected wavefront distortion within lambda divided by 10 at 633 nm.

17. The method of claim 1, wherein the diffusion bond between the first planar surface of the first optical crystal material and the first planar surface of the second optical crystal material is offset from one or more crystal axes by an angle.

18. The method of claim 1, wherein the first optical crystal material comprises a height, a width, and a thickness, wherein the second optical crystal material comprises a same thickness and one or more of a same height or a same width as the first optical crystal material.

19. The method of claim 18, wherein the first optical crystal material and the second optical crystal material are rectangular cubes.

20. The method of claim 19, further comprising cutting a rotated sub-structure from the diffusion bonded first optical crystal material and second optical crystal material so that the diffusion bond is angled relative to at least one surface of the diffusion bonded first optical crystal material and second optical crystal material.

21. The method of claim 18, wherein one or more of the height and the width of the first optical crystal material is greater than the thickness, and wherein the first planar surface of the first optical crystal material is formed by one of the height or width and thickness of the first optical crystal material.

22. The method of claim 18, wherein the first optical crystal material is diffusion bonded to the second optical crystal material so that the input surface of the diffusion bonded first and second optical crystal materials comprises a surface area greater than the height and the width of the first optical crystal material and second optical crystal material.

23. The method of claim 18, wherein the first optical crystal material is diffusion bonded to the second optical crystal material so that a length of the planar surface is greater than the height, the width, and the thickness of the first optical crystal material and second optical crystal material.

24. The method of claim 1, wherein at least one of the first optical crystal material and the second optical crystal material is trapezoidal.

25. The method of claim 1, wherein the first optical crystal material and the second optical crystal material are non-linear optical crystal materials.

26. The method of claim 1, wherein the first optical crystal material and the second optical crystal material are Lithium triborate (LBO).

27. The method of claim 1, wherein the first optical crystal material and the second optical crystal material are Beta barium borate (BBO).

28. The method of claim 1, wherein the input surface is a planar input surface, and wherein the first optical crystal material and the second optical crystal material are combined to increase an aperture area.

29. The method of claim 1, wherein the first optical crystal material and the second optical crystal material are combined to increase length.

30. The method of claim 1, wherein the one or more diffusion bonds extend from the input surface to an output surface.

31. An optical crystal material comprising;

a plurality of optical crystal materials having a same material type and aligned crystal orientations, wherein the plurality of optical crystal materials comprise planar surfaces diffusion bonded along one or more dimensions to form a composite optical crystal material having one or more diffusion bonds, the composite optical crystal material comprising an input surface, wherein the one or more diffusion bonds between the planar surfaces of the plurality of optical crystal materials are configured at an angle to a phase matched k-vector inside the composite optical crystal material.

32. The optical crystal material of claim 31, wherein the angle is between 0.25 degrees and 45 degrees.

33. The optical crystal material of claim 31, wherein the input surface is a planar surface.

34. The optical crystal material of claim 31, wherein the input surface has a composite surface area greater than surface areas of the component surfaces of the plurality of optical crystal materials.

35. The optical crystal material of claim 34, wherein plurality of optical crystal materials are combined to increase an aperture area.

36. The optical crystal material of claim 31, wherein the composite optical crystal material has a length greater than a height, a width, and a thickness of each of the plurality of optical crystal materials.

37. The optical crystal material of claim 31, wherein a crystal axis of each of the plurality of optical crystal materials is perpendicular to the diffusion bonded planar surfaces.

38. The optical crystal material of claim 31, wherein a crystal axis of each of the plurality of optical crystal materials is configured at a second angle to the diffusion bonded planar surfaces.

39. The optical crystal material of claim 31, wherein the plurality of optical crystal materials are nonlinear optical crystal materials.

40. The optical crystal material of claim 31, wherein the plurality of optical crystal materials are linear optical crystal materials.

41. The optical crystal material of claim 31, wherein the plurality of optical crystal materials are Lithium triborate (LBO).

42. The optical crystal material of claim 31, wherein the plurality of optical crystal materials are Beta barium borate (BBO).

43. The optical crystal material of claim 31, wherein the aligned crystal orientations of the plurality of optical crystal materials are aligned within 80 arc seconds.

44. The optical crystal material of claim 31, wherein the one or more diffusion bonds extend from the input surface to an output surface.

* * * * *